US012641933B2

(12) United States Patent

Niu et al.

(10) Patent No.: US 12,641,933 B2

(45) Date of Patent: May 26, 2026

(54) DISPLAY PANEL AND METHOD FOR MANUFACTURING THE SAME

(71) Applicant: BOE TECHNOLOGY GROUP CO., LTD., Beijing (CN)

(72) Inventors: Yanan Niu, Beijing (CN); Yan Qu, Beijing (CN); Jing Niu, Beijing (CN); Tingting Zhou, Beijing (CN); Shuang Sun, Beijing (CN); Wei Wang, Beijing (CN); Hongwei Tian, Beijing (CN); Bin Qin, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 471 days.

(21) Appl. No.: 18/250,446

(22) PCT Filed: Jun. 30, 2022

(86) PCT No.: PCT/CN2022/102742

§ 371 (c)(1),
(2) Date: Apr. 25, 2023

(87) PCT Pub. No.: WO2024/000377

PCT Pub. Date: Jan. 4, 2024

(65) Prior Publication Data

US 2025/0081686 A1    Mar. 6, 2025

(51) Int. Cl.
H10H 20/853        (2025.01)
H01L 25/075        (2006.01)
(Continued)

(52) U.S. Cl.
CPC ......... H10H 20/853 (2025.01); H01L 25/167 (2013.01); H10H 20/01 (2025.01);
(Continued)

(58) Field of Classification Search
CPC .... H01H 29/8552; H01H 29/37; H01H 29/24; H01H 29/853; H01H 29/39;
(Continued)

(56) References Cited

U.S. PATENT DOCUMENTS

2011/0108866 A1*  5/2011  Lee ..................... H10H 20/853
257/E33.059
2013/0126839 A1*  5/2013  Matsushima ........ H10H 20/813
438/34

(Continued)

FOREIGN PATENT DOCUMENTS

CN       103367599 A   * 10/2013
CN       106684108 A      5/2017
(Continued)

OTHER PUBLICATIONS

Extended European Search Report in corresponding EP Application No. 22948486.0, dated Mar. 6, 2025, in 9 pgs.

*Primary Examiner* — Eliseo Ramos Feliciano
*Assistant Examiner* — Adam Joseph Mott
(74) *Attorney, Agent, or Firm* — Dority & Manning, P.A.

(57)        ABSTRACT

A display panel is disclosed and includes a driving backplane, a plurality of light-emitting devices and an encapsulation structure. The plurality of light-emitting devices are located on a first side of the driving backplane and are disposed at intervals. A light-emitting device includes a device main body and device pins. The device main body includes a light-emitting portion, and the device pins are electrically connected to the driving backplane. The encapsulation structure is located on the first side of the driving backplane and includes a light-shielding pattern and a plurality of encapsulation portions. The light-shielding pattern has a plurality of accommodation regions, an accommodation region exposes at least one light-emitting device. At least part of an encapsulation portion is located in the
(Continued)

accommodation region and covers the light-emitting device. A light-emitting portion of at least one light-emitting device is located in the accommodation region.

20 Claims, 17 Drawing Sheets

(51) Int. Cl.

| | |
|---|---|
| *H01L 25/16* | (2023.01) |
| *H10H 20/01* | (2025.01) |
| *H10H 20/857* | (2025.01) |
| *H10H 29/855* | (2025.01) |

(52) U.S. Cl.
CPC ...... *H10H 20/857* (2025.01); *H10H 29/8552* (2025.01); *H01L 25/0753* (2013.01); *H10H 20/0362* (2025.01); *H10H 20/0364* (2025.01)

(58) Field of Classification Search
CPC .. H01H 20/852; H01H 29/852; H01H 20/853; H01H 20/855; H01H 29/855
See application file for complete search history.

(56) References Cited

U.S. PATENT DOCUMENTS

| | | | |
|---|---|---|---|
| 2017/0133357 A1 * | 5/2017 | Kuo | H10H 20/855 |
| 2018/0348918 A1 | 12/2018 | Rhe et al. | |
| 2019/0251894 A1 | 8/2019 | Lee et al. | |
| 2019/0288156 A1 | 9/2019 | Chaji et al. | |
| 2020/0013766 A1 * | 1/2020 | Kim | H01L 25/167 |
| 2020/0161283 A1 | 5/2020 | Mun et al. | |
| 2020/0235084 A1 * | 7/2020 | Wu | H10H 20/85 |
| 2021/0057616 A1 * | 2/2021 | Kuo | H01L 25/0753 |
| 2022/0375911 A1 | 11/2022 | Li et al. | |
| 2023/0174857 A1 * | 6/2023 | Sun | G03F 7/0007 |
| | | | 430/321 |

FOREIGN PATENT DOCUMENTS

| | | | | | |
|---|---|---|---|---|---|
| CN | 109360493 A | 2/2019 | | | |
| CN | 109979960 A | 7/2019 | | | |
| CN | 112151567 A | 12/2020 | | | |
| CN | 112882282 A | 6/2021 | | | |
| CN | 109212825 B | 7/2021 | | | |
| CN | 113451488 A | 9/2021 | | | |
| CN | 114023779 A | 2/2022 | | | |
| TW | I757181 B | * | 3/2022 | ......... | H01L 25/0753 |

* cited by examiner

200

100

119

118

115

115

118

115

Figure 10:
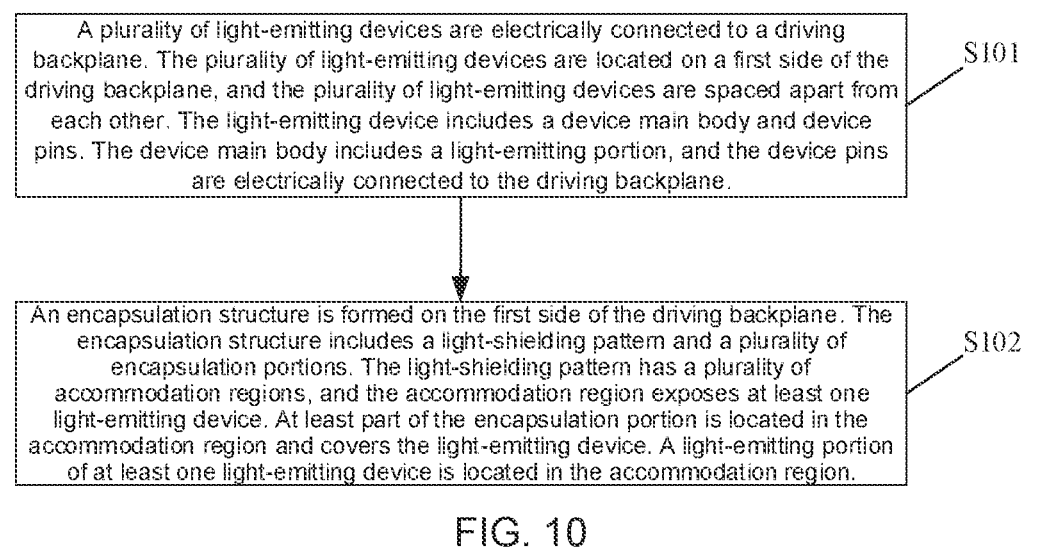

A plurality of light-emitting devices are electrically connected to a driving backplane. The plurality of light-emitting devices are located on a first side of the driving backplane, and the plurality of light-emitting devices are spaced apart from each other. The light-emitting device includes a device main body and device pins. The device main body includes a light-emitting portion, and the device pins are electrically connected to the driving backplane.

S101

An encapsulation structure is formed on the first side of the driving backplane. The encapsulation structure includes a light-shielding pattern and a plurality of encapsulation portions. The light-shielding pattern has a plurality of accommodation regions, and the accommodation region exposes at least one light-emitting device. At least part of the encapsulation portion is located in the accommodation region and covers the light-emitting device. A light-emitting portion of at least one light-emitting device is located in the accommodation region.

DISPLAY PANEL AND METHOD FOR MANUFACTURING THE SAME

CROSS-REFERENCE TO RELATED APPLICATION

This application is a national phase entry under 35 USC 371 of International Patent Application No. PCT/CN2022/102742, filed on Jun. 30, 2022, which is incorporated herein by reference in its entirety.

TECHNICAL FIELD

The present disclosure relates to the field of display technologies, and in particular, to a display panel and a method for manufacturing the same.

BACKGROUND

The display panel includes a plurality of light-emitting devices, and the plurality of light-emitting devices are used to emit light outwards, so that the display panel can realize an image display function.

SUMMARY

In an aspect, a display panel is provided. The display panel includes a driving backplane, a plurality of light-emitting devices and an encapsulation structure. The plurality of light-emitting devices are located on a first side of the driving backplane, and the plurality of light-emitting devices are disposed at intervals. A light-emitting device includes a device main body and device pins. The device main body includes a light-emitting portion, and the device pins are electrically connected to the driving backplane. The encapsulation structure is located on the first side of the driving backplane, and the encapsulation structure includes a light-shielding pattern and a plurality of encapsulation portions. The light-shielding pattern has a plurality of accommodation regions, an accommodation region exposes at least one light-emitting device. At least part of an encapsulation portion is located in the accommodation region and covers the light-emitting device. A light-emitting portion of at least one light-emitting device is located in the accommodation region.

In some embodiments, the accommodation region has a top opening and a bottom opening. The top opening is farther away from the driving backplane than the bottom opening. An area of the top opening is larger than an area of the bottom opening.

In some embodiments, the accommodation region has a side wall. The side wall and a surface of the light-shielding pattern proximate to the driving backplane have a first included angle therebetween, and the first included angle is an acute angle.

In some embodiments, the first included angle is less than or equal to 75°.

In some embodiments, in a thickness direction of the driving backplane, an end surface of the encapsulation portion away from the driving backplane is higher than an end surface of the light-shielding pattern away from the driving backplane. The end surface of the encapsulation portion away from the driving backplane is a first curved surface, and the first curved surface is convex in a direction away from the driving backplane.

In some embodiments, the encapsulation portion includes a first part of the encapsulation portion and a second part of the encapsulation portion, and the first part of the encapsulation portion is closer to the driving backplane relative to the second part of the encapsulation portion. The first part of the encapsulation portion surrounds the light-emitting device, and an end surface of the first part of the encapsulation portion away from the driving backplane is flush with an end surface of the light-emitting device away from the driving backplane. The second part of the encapsulation portion is located on a side of the first part of the encapsulation portion away from the driving backplane, and covers the first part of the encapsulation portion and the light-emitting device. The end surface of the first part of the encapsulation portion away from the driving backplane and the driving backplane have a third distance therebetween. An end surface of the second part of the encapsulation portion proximate to the first part of the encapsulation portion and an end surface of the second part of the encapsulation portion away from the first part of the encapsulation portion have a fourth distance therebetween. The end surface of the light-shielding pattern away from the driving backplane and the driving backplane have a fifth distance therebetween. The fifth distance is greater than or equal to the third distance and less than or equal to a sum of 50% of the fourth distance and the third distance.

In some embodiments, a shape of the light-shielding pattern in a longitudinal section includes a semi-ellipse, and the longitudinal section is parallel to a thickness direction of the driving backplane. The semi-ellipse has a first side and a second side, and both ends of the first side are connected to both ends of the second side. The first side is disposed proximate to the driving backplane, and the second side is convex in a direction away from the driving backplane.

In some embodiments, in the thickness direction of the driving backplane, an end surface of the encapsulation portion away from the driving backplane is lower than an end surface of the light-shielding pattern away from the driving backplane. At least a central region of the end surface of the encapsulation portion away from the driving backplane is a plane.

In some embodiments, the light-shielding pattern includes a first part of the light-shielding pattern and a second part of the light-shielding pattern, and the first part of the light-shielding pattern is closer to the driving backplane relative to the second part of the light-shielding pattern. An end surface of the first part of the light-shielding pattern away from the driving backplane is flush with an end surface of the light-emitting device away from the driving backplane. The second part of the light-shielding pattern is located on a side of the first part of the light-shielding pattern away from the driving backplane. The end surface of the first part of the light-shielding pattern away from the driving backplane and the driving backplane have a first distance therebetween. An end surface of the second part of the light-shielding pattern proximate to the first part of the light-shielding pattern and an end surface of the second part of the light-shielding pattern away from the first part of the light-shielding pattern have a second distance therebetween. The second distance is greater than or equal to 30% of the first distance and less than or equal to twice the first distance.

In some embodiments, the accommodation region includes a first accommodation sub-region and a second accommodation sub-region, and the first accommodation sub-region and the second accommodation sub-region are communicated. An orthographic projection of an edge of an opening of the first accommodation sub-region on the driving backplane is located within a region surrounded by an orthographic projection of an edge of an opening of the second accommodation sub-region on the driving backplane. The driving backplane includes a backplane main body and a plurality of pad components. The plurality of pad components are electrically connected to the backplane main body. A pad component passes through the first accommodation sub-region and is soldered to the at least one light-emitting device. The light-emitting portion of the at least one light-emitting device is located in the second accommodation sub-region.

In some embodiments, the light-shielding pattern includes a first light-shielding sub-pattern and a second light-shielding sub-pattern that are stacked, and the first light-shielding sub-pattern is closer to the driving backplane relative to the second light-shielding sub-pattern. The first light-shielding sub-pattern has the first accommodation sub-region, and the second light-shielding sub-pattern has the second accommodation sub-region.

In some embodiments, a shape of the first light-shielding sub-pattern in a longitudinal section includes a first trapezoid, and the longitudinal section is parallel to a thickness direction of the driving backplane. The first trapezoid has a first base and a second base, the first base is parallel to the second base, and a length of the first base is smaller than a length of the second base. The first base is closer to the driving backplane relative to the second base; or the first base is farther away from the driving backplane relative to the second base.

In some embodiments, a pad component includes at least two conductive pads. A conductive pad includes an extension surface and a soldering surface. The soldering surface is connected to an end of the extension surface away from the backplane main body. The device pins are soldered onto the soldering surface. The first accommodation sub-region has a first sub-side wall, and the first sub-side wall is in contact with at least a portion of the extension surface.

In some embodiments, in a thickness direction of the driving backplane, a border region of the soldering surface is higher than a central region of the soldering surface.

In some embodiments, a shape of the second light-shielding sub-pattern in a longitudinal section includes a second trapezoid, and the longitudinal section is parallel to a thickness direction of the driving backplane. The second trapezoid has a third base and a fourth base, the third base is parallel to the fourth base, and a length of the third base is smaller than a length of the fourth base. The third base is farther away from the driving backplane relative to the fourth base; or the third base is closer to the driving backplane relative to the fourth base.

In some embodiments, the second accommodation sub-region has a second sub-side wall. The display panel further includes a reflective layer. The reflective layer covers at least a portion of the second sub-side wall; and/or the reflective layer covers at least a portion of a surface of the first light-shielding sub-pattern away from the driving backplane.

In some embodiments, at least a central region of an end surface of the encapsulation portion away from the driving backplane is a plane. Or, the end surface of the encapsulation portion away from the driving backplane is a second curved surface, and the second curved surface is convex in a direction away from the driving backplane.

In some embodiments, in a thickness direction of the driving backplane, an end surface of the encapsulation portion away from the driving backplane is higher than an end surface of the light-shielding pattern away from the driving backplane. The encapsulation portion covers a border region of the end surface of the light-shielding pattern away from the driving backplane.

In some embodiments, the encapsulation portion includes a first part of the encapsulation portion and a second part of the encapsulation portion, and the first part of the encapsulation portion is closer to the driving backplane relative to the second part of the encapsulation portion. The first part of the encapsulation portion surrounds the light-emitting device, and an end surface of the first part of the encapsulation portion away from the driving backplane is flush with an end surface of the light-emitting device away from the driving backplane. The second part of the encapsulation portion is located on a side of the first part of the encapsulation portion away from the driving backplane, and covers the first part of the encapsulation portion and the light-emitting device. The end surface of the first part of the encapsulation portion away from the driving backplane and the driving backplane have a third distance therebetween. An end surface of the second part of the encapsulation portion proximate to the first part of the encapsulation portion and an end surface of the second part of the encapsulation portion away from the first part of the encapsulation portion have a fourth distance therebetween. The fourth distance is greater than or equal to 30% of the third distance and less than or equal to twice the third distance.

In some embodiments, the display panel further includes a protective layer. The protective layer covers at least one of an end surface of the light-shielding pattern away from the driving backplane and an end surface of the encapsulation portion away from the driving backplane.

In some embodiments, the display panel further includes a touch layer. The touch layer is located on a side of the plurality of light-emitting devices away from the driving backplane. The touch layer includes a plurality of touch electrodes, and a touch electrode includes grid lines. An orthographic projection of the grid lines on the driving backplane is located within an orthographic projection of the light-shielding pattern on the driving backplane.

In some embodiments, the device main body includes a main body structure and an adherent structure, the light-emitting portion is located in the main body structure, and the adherent structure is connected to the main body structure.

In another aspect, a method for manufacturing a display panel is provided. The method is configured to manufacture the above display panel. The method for manufacturing the display panel includes: electrically connecting the plurality of light-emitting devices to the driving backplane; and forming the encapsulation structure on the first side of the driving backplane. The plurality of light-emitting devices are located on the first side of the driving backplane, and the plurality of light-emitting devices are disposed at intervals. The plurality of light-emitting devices each include the device main body and the device pins. The device main body includes the light-emitting portion, and the device pins are electrically connected to the driving backplane. The encapsulation structure includes the light-shielding pattern and the plurality of encapsulation portions. The light-shielding pattern has the plurality of accommodation regions, and the accommodation region exposes the at least one light-emitting device. At least the part of the encapsulation portion is located in the accommodation region and covers the light-emitting device. The light-emitting portion of the at least one light-emitting device is located in the accommodation region.

In some embodiments, forming the encapsulation structure on the first side of the driving backplane, includes: firstly forming the plurality of encapsulation portions on the first side of the driving backplane; and forming the light-shielding pattern on the first side of the driving backplane. Alternatively, forming the encapsulation structure on the first side of the driving backplane, includes: firstly forming the light-shielding pattern on the first side of the driving backplane; and forming the encapsulation portions in the accommodation regions of the light-shielding pattern.

In yet another aspect, a display apparatus is provided. The display apparatus includes the display panel as described in the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

FIG. 10 is a flow diagram of steps of a method for manufacturing a display panel, in accordance with some embodiments of the present disclosure.

DETAILED DESCRIPTION

Figure 1:
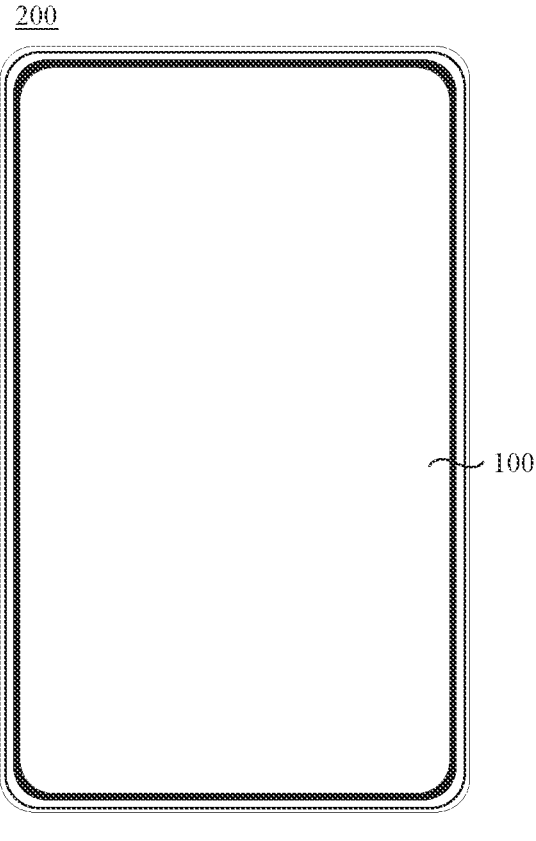
FIG. 1 is a structural diagram of a display apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, term "a plurality of" or "the plurality of" means two or more unless otherwise specified.

In the description of some embodiments, the expressions "connected" and derivatives thereof may be used. For example, the term "connected" may be used in the description of some embodiments to indicate that two or more components are in direct physical or electrical contact with each other.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term such as "parallel", "perpendicular" or "equal" include a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Variations in shapes relative to the accompanying drawings due to, for example, manufacturing technologies and/or tolerances may be envisaged. Therefore, the exemplary embodiments should not be construed to be limited to the shapes of regions shown herein, but to include deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

FIG. 1 is a structural diagram of a display apparatus, in accordance with some embodiments.

As shown in FIG. 1, some embodiments of the present disclosure provide a display apparatus 200. In some examples, the display apparatus 200 may be a notebook computer, a mobile telephone, a wireless device, a personal digital assistant (PDA), a hand-held or portable computer, a global positioning system (GPS) receiver/navigator, a camera, an MPEG-4 Part 14 (MP4) video player, a video camera, a game console, a watch, a clock, a calculator, a television (TV) monitor, a flat-panel display, a computer monitor, a car display (e.g., an odometer display), a navigator, a cockpit controller and/or display, a camera view display (e.g., a rear view camera display in a vehicle), an electronic photo, an electronic billboard or sign, a projector, a packaging and aesthetic structure (e.g., a display for displaying an image of a piece of jewelry), and the like.

As shown in FIG. 1, the display apparatus 200 includes a display panel 100. It can be understood that, the display panel 100 is used to display image information. For example, the display panel 100 may be used to display still images, such as pictures or photos. The display panel 100 may also be used to display dynamic images, such as a video or game images. Embodiments of the present disclosure do not further limit the display apparatus 200, and the display panel 100 will be described as an example below.

Figure 2A:
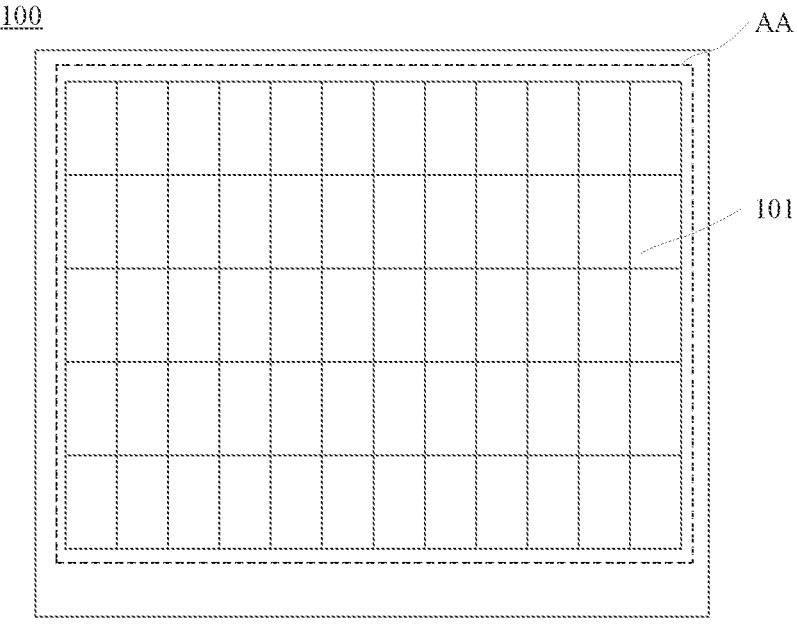
FIG. 2A is a structural diagram of a display panel, in accordance with some embodiments.

FIG. 2A is a structural diagram of a display panel, in accordance with some embodiments.

In some examples, as shown in FIG. 2A, the display panel 100 includes a plurality of sub-pixels 101, and the plurality of sub-pixels 101 are located in the display region AA of the display panel 100 and arranged in an array.

It can be understood that the sub-pixel 101 is the smallest unit for image display of the display panel 100. Each sub-pixel 101 is capable of emitting light of a single color such as red, green or blue. The display panel 100 may include a plurality of red sub-pixels, a plurality of green sub-pixels and a plurality of blue sub-pixels. By adjusting the brightness (gray scale) of sub-pixels 101 of different colors, red light, green light and blue light of different intensities may be obtained. At least two of the red light, the green light and the blue light of different intensities are superimposed, and thus light of more colors may be displayed, thereby realizing full-color display of the display panel 100.

Figure 2B:
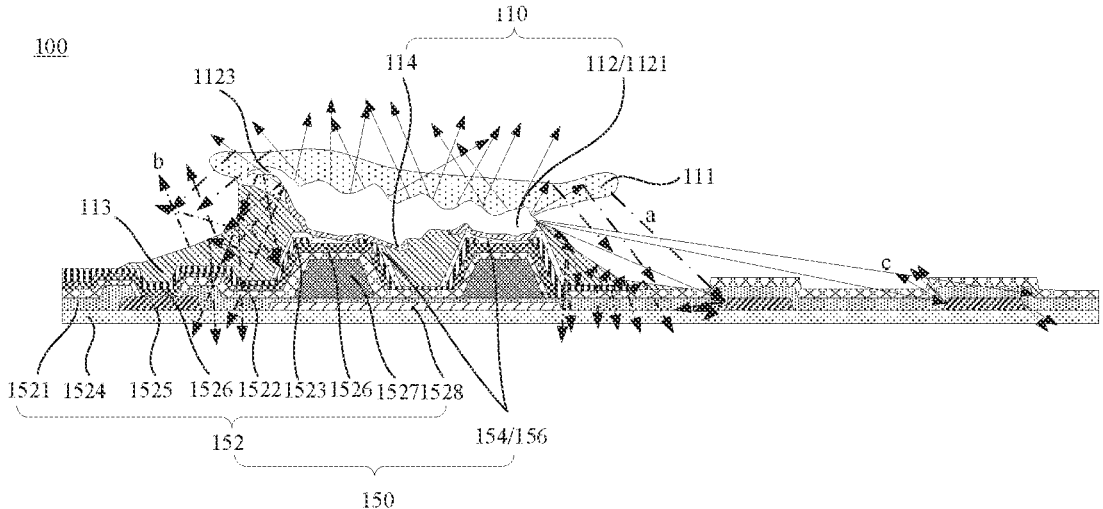
FIG. 2B is a structural diagram of another display panel, in accordance with some embodiments.

FIG. 2B is a structural diagram of another display panel, in accordance with some embodiments.

In some embodiments, as shown in FIG. 2B, the display panel 100 includes a driving backplane 150 and a plurality of light-emitting devices 110. The plurality of light-emitting devices 110 are located on the first side of the driving backplane 150, and the plurality of light-emitting devices 110 are arranged at intervals one another.

It will be noted that, in the accompanying drawings of the description of the present disclosure, only one or two light-emitting devices 110 are illustrated in order to clearly show the structure of the light-emitting device 110. The embodiments of the present disclosure do not limit the number of the light-emitting devices 110.

As shown in FIG. 2B, the plurality of light-emitting devices 110 are located on the first side of the driving backplane 150, and the plurality of light-emitting devices 110 are arranged at intervals one another. That is, the plurality of light-emitting devices 110 are located on the same side of the driving backplane 150 and are spaced apart from one another. It can be understood that, the intervals between the plurality of light-emitting devices 110 may be the same or different.

It can be understood that, a light-emitting device 110 is located in a sub-pixel 101. In some examples, the plurality of light-emitting devices 110 can each emit light independently, so as to improve the display performance of the display panel 100.

In some examples, the plurality of light-emitting devices 110 are used to emit light of different colors. For example, a part (two or more) of the light-emitting devices 110 are used to emit red light, another part (two or more) of the light-emitting devices 110 are used to emit blue light, and yet another part (two or more) of the light-emitting devices 110 are used to emit green light. As a result, the full-color display of the display panel 100 may be realized.

In some other examples, the plurality of light-emitting devices 110 are used to emit light of the same color. For example, the plurality of light-emitting devices 110 may all be used to emit white light, or the plurality of light-emitting devices 110 may all be used to emit blue light. In a case where the plurality of light-emitting devices 110 are used to emit the light of the same color, the display panel 100 further includes a color conversion film (not shown in the figures).

For example, in a case where the plurality of light-emitting devices 110 are all used to emit white light, the color conversion film may include a red filter film, a green filter film and a blue filter film. The white light is filtered by filter films of different colors to obtain red light, green light and blue light, so that the full-color display of the display panel 100 may be realized.

For example, in a case where the plurality of light-emitting devices 110 are all used to emit blue light, the color conversion film may be a quantum dot film. The quantum dot film includes red quantum dots and green quantum dots. When the blue light emitted by the light-emitting devices 110 is incident on the quantum dot film, the red quantum dots may convert blue light into red light, and the green quantum dots may convert blue light into green light. As a result, the full-color display of the display panel 100 may be realized.

In some examples, the light-emitting device 110 is a light-emitting diode (abbreviated as LED). For example, the light-emitting device 110 may be any of a traditional LED, a mini light-emitting diode (abbreviated as mini LED) or a micro light-emitting diode (abbreviated as micro LED).

For example, the traditional LED means that the size of the LED is greater than or equal to 500 μm. The mini LED means that the size of the LED is greater than or equal to 100 μm and less than 500 μm. The micro LED means that the size of the LED is less than 100 μm. In some examples, for the micro LED, the size of the LED may be less than or equal to 50 μm.

The embodiments of the present disclosure do not limit the size of the light-emitting device 110. The following will be illustrated by considering an example of the light-emitting device 110 being the micro LED.

It can be understood that, micro LED is a new type of display technology that thins, miniaturizes and arrays LEDs, so that each LED is smaller than 100 μm in size. Compared with an organic light-emitting diode (OLED) display, micro LED has a longer service life, faster response speed (up to nanosecond level), high brightness, low power consumption, super high resolution and other advantages.

Figure 2C:
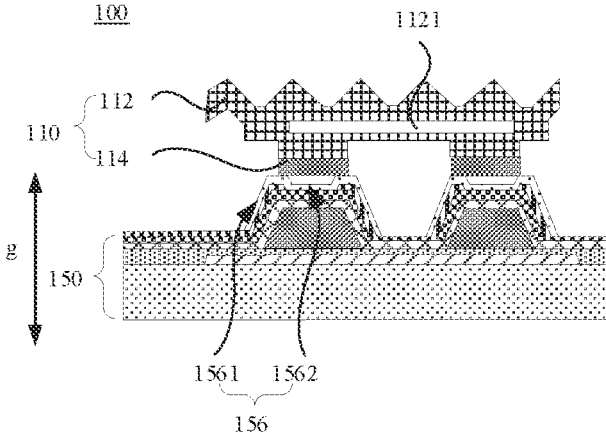
FIG. 2C is a diagram of a position relationship between a light-emitting device and a driving backplane, in accordance with some embodiments.
Figure 2D:
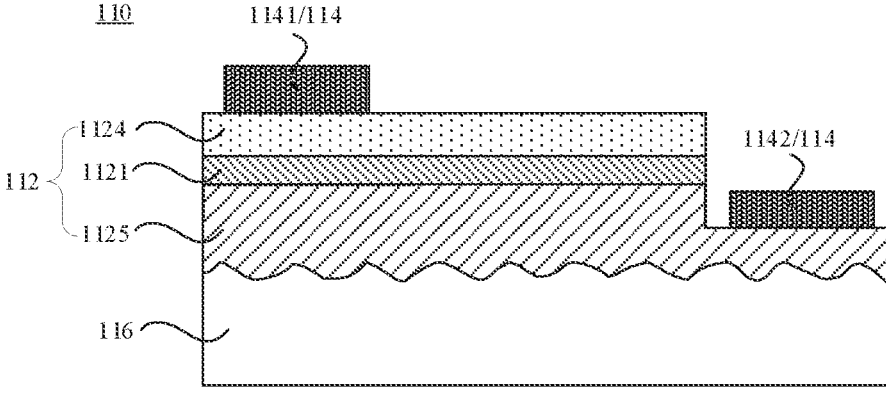
FIG. 2D is a structural diagram of a light-emitting device, in accordance with some embodiments.

FIG. 2C is a diagram of a position relationship between the light-emitting device and the driving backplane, in accordance with some embodiments. FIG. 2D is a structural diagram of a light-emitting device, in accordance with some embodiments.

In some examples, as shown in FIGS. 2B and 2C, the light-emitting device 110 includes a device main body 112 and device pins 114. As shown in FIG. 2C, the device main body 112 includes a light-emitting portion 1121, and the device pins 114 are electrically connected to the driving backplane 150.

It can be understood that, the light-emitting portion 1121 is used to emit light. In some examples, as shown in FIG. 2D, the device main body 112 includes an N-type doped semiconductor 1125 and a P-type doped semiconductor 1124, and the light-emitting portion 1121 is located between the N-type doped semiconductor 1125 and the P-type doped semiconductor 1124.

It can be understood that, in some examples, the N-type doped semiconductor 1125 is N-type gallium nitride, the P-type doped semiconductor 1124 is P-type gallium nitride, and the light-emitting portion 1121 is a multiple quantum well. It can be understood that, the N-type doped semiconductor 1125 can provide electrons, and the P-type doped semiconductor 1124 can provide holes, and the electrons and holes are transported into the multiple quantum well and combined in the multiple quantum well, so that the multiple quantum well is capable of emitting light.

As shown in FIG. 2C, the device pins 114 are electrically connected to the driving backplane 150, so that the electrical signals from the driving backplane 150 may be transmitted to the device main body 112 through the device pins 114, so that the driving backplane 150 can drive the light-emitting portion 1121 to emit light.

In some examples, as shown in FIG. 2D, the device pins 114 include a first device pin 1141 and a second device pin 1142. The first device pin 1141 is electrically connected to the P-type doped semiconductor 1124, and the second device pin 1142 is electrically connected to the N-type doped semiconductor 1125.

For example, the materials of the device pins 114 may be conductive metal such as copper or aluminum, and thus the electrical conductivity of the device pins 114 may be improved. In addition, the first device pin 1141 and the second device pin 1142 may be same or different in material.

Figure 2E:
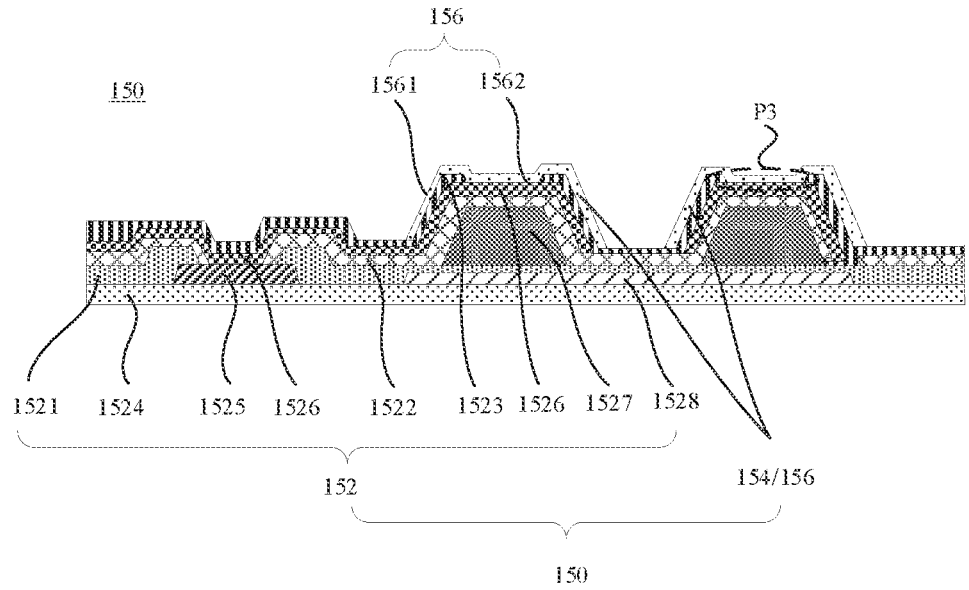
FIG. 2E is a structural diagram of a driving backplane, in accordance with some embodiments.

FIG. 2E is a structural diagram of the driving backplane, in accordance with some embodiments. The driving backplane 150 will be illustrated below with reference to FIG. 2E.

In some examples, as shown in FIG. 2E, the driving backplane 150 includes a backplane main body 152 and a plurality of pad components 154, and the plurality of pad components 154 are electrically connected to the backplane main body 152.

For example, as shown in FIG. 2E, the backplane main body 152 includes a substrate 1524, a first insulating layer 1521, a second insulating layer 1522, a third insulating layer 1523, circuit traces 1525 and a conductive layer 1526.

In some examples, the substrate 1524 is a rigid substrate. In some other examples, the substrate 1524 is a flexible substrate. For example, the material of the substrate 1524 includes any one of plastic, FR-4 grade material, resin, glass, quartz, polyimide, polymethyl methacrylate (PMMA) or low temperature polysilicon (LTPS).

As shown in FIG. 2E, the circuit traces 1525 are located on a side of the substrate 1524. It can be understood that, the circuit traces 1525 are used to transmit electrical signals. In some examples, the circuit traces 1525 are made of copper, which may improve the electrical conductivity of the circuit traces 1525.

As shown in FIG. 2E, the first insulating layer 1521 is located on a side of the circuit trace 1525 away from the substrate 1524, and plays a role of electrical isolation.

For example, as shown in FIG. 2E, the backplane main body 152 further includes a plurality of protruding portions 1527. The protruding portions 1527 are located on a side of the first insulating layer 1521 away from the substrate 1524. It can be understood that, the protruding portion 1527 protrudes towards a direction away from the substrate 1524.

In some examples, the protruding portion 1527 is in the shape of a cone frustum or approximately a cone frustum, and an upper bottom surface of the cone frustum is farther away from the substrate 1524 than a lower bottom surface of the cone frustum. It can be understood that, the upper bottom surface of the cone frustum is parallel to the lower bottom surface of the cone frustum, and an area of the upper bottom surface is smaller than an area of the lower bottom surface. In some examples, the material of the protruding portion 1527 includes resin.

For example, as shown in FIG. 2E, the second insulating layer 1522 covers a surface of the protruding portions 1527 away from the substrate 1524 and a surface of the first insulating layer 1521 away from the substrate 1524, and plays a role of electrical isolation.

For example, as shown in FIG. 2E, the conductive layer 1526 is located on a side of the second insulating layer 1522 away from the substrate 1524. An orthogonal projection of the conductive layer 1526 on the substrate 1524 covers an orthogonal projection of the protruding portions 1527 on the substrate 1524. That is, a part of the conductive layer 1526 may extend along an extending direction of an outer surface of the protruding portion 1527. In addition, the conductive layer 1526 may further pass through the first insulating layer 1521 and the second insulating layer 1522 to be electrically connected to the circuit trace 1525.

For example, as shown in FIG. 2E, the third insulating layer 1523 covers a side of the conductive layer 1526 away from the substrate 1524, and plays a role of electrical isolation. Moreover, as shown in FIG. 2E, the third insulating layer 1523 has via holes P3, and an orthographic projection of an edge of the via hole P3 on the substrate 1524 is located within an orthographic projection of the upper bottom surface of the protruding portion 1527 on the substrate 1524. In this way, the conductive layer 1526 covering the bottom surface of the protruding portion 1527 may be exposed through the via hole P3 in the third insulating layer 1523.

The plurality of pad components 154 are electrically connected to the backplane main body 152. For example, as shown in FIG. 2E, the pad component 154 includes at least two conductive pads 156. An orthogonal projection of the conductive pad 156 on the substrate 1524 covers an orthogonal projection of a protruding portion 1527 on the substrate 1524. That is, at least a part of the conductive pad 156 may extend along the extending direction of the outer surface of the protruding portion 1527.

In this way, as shown in FIG. 2E, the conductive pads 156 may be electrically connected to the exposed conductive layer 1526 through the via holes P3 in the third insulating layer 1523, that is, the pad component 154 may be electrically connected to the backplane main body 152.

In some examples, the material of the conductive pad 156 is indium tin oxide (ITO).

In some examples, the number of the conductive pads 156 in the pad component 154 may be two, four, six, etc. It can be seen from the above that the device pins 114 are electrically connected to the driving backplane 150. In some examples, the light-emitting device 110 includes two device pins 114 (e.g., a first device pin 1141 and a second device pin 1142), and a device pin 114 is soldered onto a conductive pad 156.

That is, in a case where the pad component 154 includes two conductive pads 156, the pad component 154 may be electrically connected to one light-emitting device 110; in a case where the pad component 154 includes four conductive pads 156, the pad component 154 may be electrically connected to two light-emitting devices 110, and so on.

In some examples, as shown in FIG. 2E, the conductive pad 156 includes an extension surface 1561 and a soldering surface 1562. The extension surface 1561 extends in a direction away from the backboard main body 152. The soldering surface 1562 is connected to an end of the extension surface 1561 away from the backplane main body 152.

It can be understood that, as shown in FIG. 2E, the extension surface 1561 may cover a side surface of the protruding portion 1527, and the soldering surface 1562 may cover the upper bottom surface of the protruding portion 1527.

In this way, as shown in FIG. 2E, the conductive pad 156 may extend in the direction away from the backplane main body 152, and the soldering surface 1562 may pass through the via hole P3 in the third insulating layer 1523 to be electrically connected with the exposed conductive layer 1526, so that the conductive pad 156 may be electrically connected to the conductive layer 1526.

As shown in FIG. 2C, the device pins 114 are soldered onto the soldering surface 1562, so that the light-emitting device 110 may be electrically connected to the driving backplane 150.

It can be understood that, the conductive pad 156 includes the extension surface 1561, the extension surface 1561 extends in the direction away from the backplane main body 152, and the soldering surface 1562 is connected to the end of the extension surface 1561 away from the backplane main body 152. Therefore, it may be possible to improve the convenience of soldering between the device pins 114 and the soldering surface 1562 of the conductive pad 156, improve the yield of soldering between the device pins 114 and the soldering surface 1562, and improve the production efficiency of the display panel 100.

In some examples, as shown in FIG. 2E, in a thickness direction of the driving backplane 150 (shown by the direction of the arrow g in FIG. 2C), a border region of the soldering surface 1562 is higher than a central region of the soldering surface 1562.

It can be understood that, since the third insulating layer 1523 is provided with the via holes P3 therein, the central region of the soldering surface 1562 may be located in the via hole P3 and electrically connected to the exposed conductive layer 1526. Therefore, in the thickness direction of the driving backplane 150, the border region of the soldering surface 1562 may be higher than the central region of the soldering surface 1562.

For example, the device pins 114 may be soldered onto the border region of the soldering surface 1562. Therefore, it may further be possible to improve the convenience of soldering between the device pins 114 and the soldering surface 1562 of the conductive pad 156, improve the yield of soldering between the device pins 114 and the soldering surface 1562, and improve the production efficiency of the display panel 100.

It can be understood that, as shown in FIG. 2C, since the border region of the soldering surface 1562 is higher than the central region of the soldering surface 1562 in the thickness direction of the driving backplane 150 (shown by the direction of the arrow g in FIG. 2C), so that in a case where the device pins 114 are in contact with the border region of the soldering surface 1562, there will be a gap between the device pins 114 and the central region of the soldering surface 1562.

In some examples, solder may be added between the central region of the soldering surface 1562 and the device pins 114, so as to improve the firmness of soldering between the soldering surface 1562 and the device pins 114.

In some examples, as shown in FIG. 2E, the backplane main body 152 further includes a light-shielding layer 1528, and the light-shielding layer 1528 is located between the substrate 1524 and the first insulating layer 1521. For example, an orthographic projection of the light-shielding layer 1528 on the substrate 1524 covers orthographic projections of the two conductive pads 156 soldered to the same light-emitting device 110 on the substrate 1524.

It can be understood that the light-emitting device 110 is a Lambertian radiator, that is, the light-emitting device 110 can emit light in all directions.

Therefore, the orthographic projection of the light-shielding layer 1528 on the substrate 1524 covers the orthographic projections of the two conductive pads 156 soldered to the same light-emitting device 110 on the substrate 1524, so that in a case where the light-emitting device 110 is soldered onto the conductive pads 156, the light-shielding layer 1528 may block the light emitted by the light-emitting portion 1121, thereby reducing the intensity of the light irradiated to a side of the substrate 1524 away from the light-emitting device 110, improving the light leakage phenomenon on the back of the display panel 100, and improving the display performance of the display panel 100.

In some embodiments, the driving backplane 150 is an active matrix (AM) driving backplane. That is, the driving backplane 150 further includes pixel driving circuits (not shown in the figures). It can be understood that, the pixel driving circuits are located between the substrate 1524 and the conductive pads 156.

The driving backplane 150 includes a plurality of gate lines and a plurality of data lines, the plurality of gate lines and the plurality of data lines are located on the substrate 1524, and the pixel driving circuit is electrically connected to the gate line and the data line. Under control of a gate scanning signal from the gate line, the pixel driving circuit receives a data signal from the data line and then outputs a driving signal.

In some examples, the pixel driving circuit includes thin film transistors (TFTs), and the thin film transistors include a driving transistor. The driving transistor is located between the substrate 1524 and the conductive pads 156, and the conductive pad 156 is electrically connected to the driving transistor. The driving transistor can output the driving signal, and the driving signal may be transmitted to the light-emitting device 110 through the conductive pads 156, so that the pixel driving circuit can achieve the driving effect on the light-emitting device 110.

In some examples, the pixel driving circuit may be a 2T1C driving circuit, that is, the pixel driving circuit includes two transistors and one capacitor. In some other examples, the pixel driving circuit may be a 7T1C pixel driving circuit (that is, including seven thin film transistors and one capacitor) or a 6T2C pixel driving circuit (that is, including six thin film transistors and one capacitor), or the like.

It can be understood that the driving backplane 150 is set as the AM driving backplane, so that the driving backplane 150 may separately drive the plurality of light-emitting devices 110 to emit light, that is, the plurality of light-emitting devices 110 can emit light independently, thereby improving the display performance of the display panel 100.

Referring to FIG. 2D, the method for manufacturing the light-emitting device 110 will be exemplarily described below.

It can be seen from the above that the device main body 112 of the light-emitting device 110 includes the N-type doped semiconductor 1125, the light-emitting portion 1121 and the P-type doped semiconductor 1124. In some examples, as shown in FIG. 2D, the device main body 112 may be formed on a side of a wafer substrate 116. That is, as shown in FIG. 2D, the N-type doped semiconductor 1125, the light-emitting portion 1121 and the P-type doped semiconductor 1124 are sequentially formed on the side of the wafer substrate 116.

In some examples, the wafer substrate 116 may be a sapphire substrate (the main component is alumina, and the chemical formula is $Al_2O_3$), a silicon carbide substrate (the chemical formula is SiC), or a silicon substrate (the chemical formula is Si).

It can be understood that, device main bodies 112 of the plurality of light-emitting devices 110 are formed on the side of the wafer substrate 116, and the plurality of device main bodies 112 are arranged at intervals. After the device main bodies 112 are formed, device pins 114 are electrically connected to the device main bodies 112, so as to form the light-emitting devices 110. Laser cutting is performed on the wafer substrate 116, so that the plurality of light-emitting devices 110 can be separated from each other (that is, crystal expansion). It can be understood that the wafer substrate 116 can support and protect the light-emitting devices 110, reducing the risk of damage to the light-emitting devices 110.

Figure 2F:
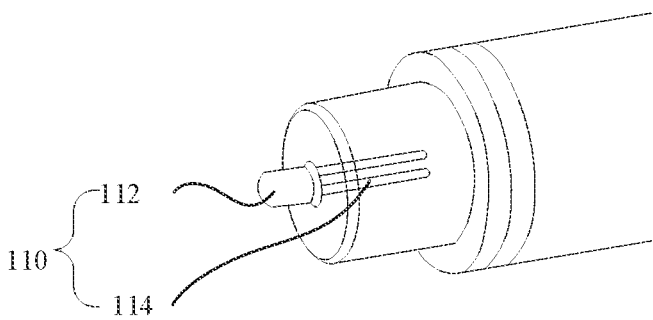
FIG. 2F is a structural diagram of a packaged light-emitting device, in accordance with some embodiments.

FIG. 2F is a structural diagram of a packaged light-emitting device, in accordance with some embodiments.

In some implementations, after cutting the wafer substrate 116, a part of the wafer substrate 116 away from the light-emitting device 110 may be removed, and another part of the wafer substrate 116 proximate to the light-emitting device 110 may be remained. As shown in FIG. 2F, the remaining part of the wafer substrate 116 and the device main body 112 of the light-emitting device 110 are packaged together, and the device pins 114 are exposed. For example, the packaged light-emitting device 110 may be soldered onto the driving backplane 150.

In some other implementations, after cutting the wafer substrate 116, the wafer substrate 116 is peeled off. After the wafer substrate 116 is peeled off, the light-emitting device 110 is soldered onto the driving backplane 150. For example, the plurality of light-emitting devices 110 may be soldered onto the driving backplane 150 in a mass transfer manner. Afterwards, a black adhesive film 111 (as shown in FIG. 2B) is used to cover the plurality of light-emitting devices 110, so as to realize the packaging of the plurality of light-emitting devices 110.

The inventors of the present disclosure have found that the above implementation has the following technical problems.

In the implementation manner of packaging first and then soldering, the plurality of light-emitting devices 110 are individually packaged, resulting in poor height uniformity between the plurality of light-emitting devices 110. Moreover, only the part of the wafer substrate 116 is removed before packaging, and the remaining part of the wafer substrate 116 is packaged together with the device main body 112, which results in a thick packaged light-emitting device 110. For example, the packaged light-emitting device 110 has a thickness in a range from 60 μm to 120 μm, resulting in an increase in the thickness of the display panel 100.

While in the implementation manner of soldering first and then packaging, as shown in FIG. 2B, the black adhesive film 111 is usually warped. Therefore, when the light emitted by the light-emitting portion 1121 is incident on the black adhesive film 111, it will be irradiated to other light-emitting devices 110 (shown by light a in FIG. 2B) due to the action of reflection or refraction of the black adhesive film 111, resulting in crosstalk generated between two adjacent light-emitting devices 110.

For example, a part (two or more) of light-emitting devices 110 are used to emit red light, another part (two or more) of light-emitting devices 110 are used to emit blue light, and yet another part (two or more) of light-emitting devices 110 are used to emit green light. Due to the different wavelengths of the red light, the blue light and the green light (the wavelength of the red light is greater than the wavelength of the green light, and the wavelength of the green light is greater than the wavelength of the blue light), when light of a color is irradiated to a light-emitting device 110 for emitting light of another color, lateral excitation may be generated between the two adjacent light-emitting devices 110. For example, light with the shorter wavelength may excite light with the longer wavelength, that is, blue light may excite red light and green light, and green light may excite red light.

That is, when light of a color is irradiated to the light-emitting device 110 for emitting light of another color, the crosstalk generated between the two adjacent light-emitting devices 110 may affect light emission of the light-emitting device 110 and thus reduce the display performance of the display panel 100.

Moreover, the black adhesive film 111 has a relatively low light transmittance. For example, since the black adhesive film 111 covers the light-emitting device 110, about 30% of the light emitted by the light-emitting portion 1121 will be blocked by the black adhesive film 111, and thus cannot exit from the display panel 100. As a result, the utilization rate of the light may be reduced, and the light extraction efficiency of the light-emitting device 110 may be reduced, thereby causing an increase in power consumption of the display panel 100.

In addition, as shown in FIG. 2B, in order to improve the reliability of soldering between the device pins 114 and the conductive pads 156, it is generally necessary to provide a soldering flux 113. In this way, when the light emitted by the light-emitting portion 1121 is incident on the soldering flux 113, it will be irradiated to other light-emitting devices 110 (shown by light b in FIG. 2B) due to the action of reflection or refraction of the soldering flux 113, resulting in crosstalk generated between two adjacent light-emitting devices 110. As a result, lateral excitation may be generated between the two adjacent light-emitting devices 110.

In addition, it can be known from the above that, the plurality of light-emitting devices 110 are formed on the side of the wafer substrate 116, and laser cutting is required to be performed on the wafer substrate 116, so that the plurality of light-emitting devices 110 are separated from each other.

For example, a region between the cutting line of the wafer substrate 116 and the light-emitting device 110 may be called a dummy region. It can be understood that when the wafer substrate 116 is cut along the cutting line, the film layer(s) (e.g., inorganic layer(s)) located in the dummy region will adhere to the device main body 112.

Figure 2G:
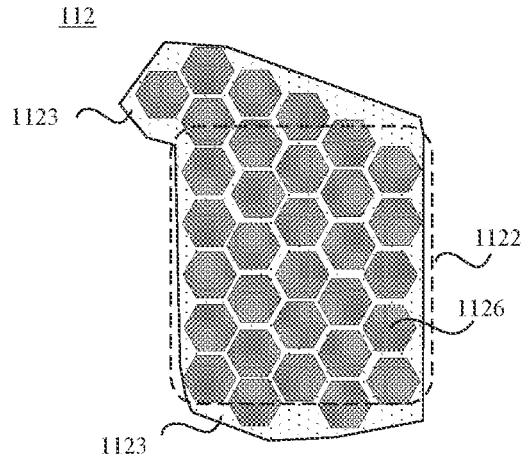
FIG. 2G is a structural diagram of a device main body, in accordance with some embodiments.
Figure 2H:
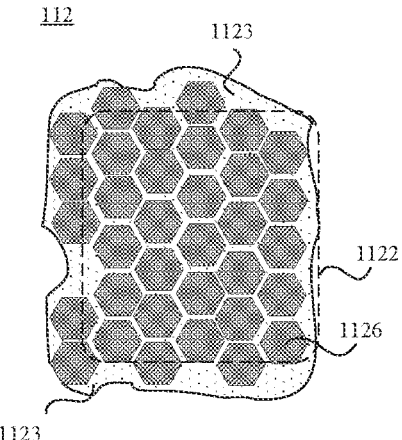
FIG. 2H is a structural diagram of another device main body, in accordance with some embodiments.
Figure 2I:
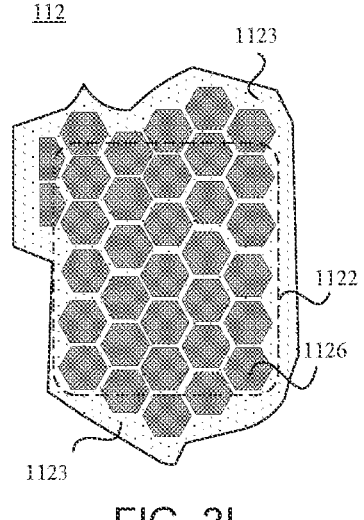
FIG. 2I is a structural diagram of yet another device main body, in accordance with some embodiments.
Figure 2J:
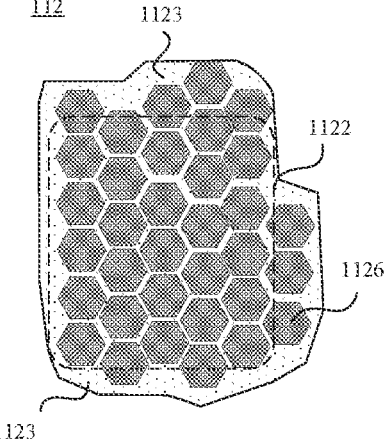
FIG. 2J is a structural diagram of yet another device main body, in accordance with some embodiments.

FIG. 2G is a structural diagram of a device main body, in accordance with some embodiments. FIG. 2H is a structural diagram of another device main body, in accordance with some embodiments. FIG. 2I is a structural diagram of yet another device main body, in accordance with some embodiments. FIG. 2J is a structural diagram of yet another device main body.

For example, as shown in FIGS. 2G to 2J, the device main body 112 includes a main body structure 1122 and an adherent structure 1123 (that is, the film layer(s) adhered to the main body structure 1122 in the dummy region). The light-emitting portion 1121 is located in the main body structure 1122, and the adherent structure 1123 is connected to the main body structure 1122.

It can be understood that, before packaging the light-emitting device 110, the adherent structure 1123 is not removed. In this way, as shown in FIGS. 2G to 2J, the shape, position and size of adherent structures 1123 in different device main bodies 112 may each be different.

In some examples, the size of the adherent structure 1123 may be larger than the size of the main body structure 1122. In some other examples, the size of the adherent structure 1123 may be smaller than the size of the main body structure 1122.

It can be understood that, since the adherent structure 1123 is connected to the main body structure 1122, the light emitted by the light-emitting portion 1121 may irradiate the adherent structure 1123 and exits outwards through the adherent structure 1123, so that side light leakage of the light-emitting device 110 may occur, thereby causing the light-emitting device 110 emits light in multiple angles. As a result, light-emitting areas of the plurality of light-emitting devices 110 are different, which may affect the display performance of the display panel 100.

Furthermore, the light will be irradiated to other light-emitting devices 110 (shown by light c in FIG. 2B) due to the action of reflection or refraction of the adherent structure 1123, resulting in crosstalk generated between two adjacent light-emitting devices 110, that is, resulting in lateral excitation generated between the two adjacent light-emitting devices 110, thereby affecting the display performance of the display panel 100.

In addition, in a case where the black adhesive film 111 is used to package multiple light-emitting devices 110, a certain pressure needs to be applied to the black adhesive film 111, so that the black adhesive film 111 can be attached to the multiple light-emitting devices 110. However, as shown in FIG. 2B, the adherent structure 1123 is usually warped relative to the main body structure 1122. When the pressure is applied to the black adhesive film 111, the adherent structure 1123 is prone to break and fall off.

It can be understood that, once the adherent structure 1123 breaks and falls off, the risk of the black adhesive film 111 being scratched increases, which may affect the packaging of the light-emitting device 110, and the broken adherent structure 1123 may cause the driving backplane 150 to be scratched, which may affect the reliability of the display panel 100.

In addition, since the adherent structure 1123 is warped, it is easy to cause the device pins 114 to fall off from the conductive pad 156 under pressure, which may affect the reliability of connection between the light-emitting device 110 and the driving backplane 150.

Figure 3A:
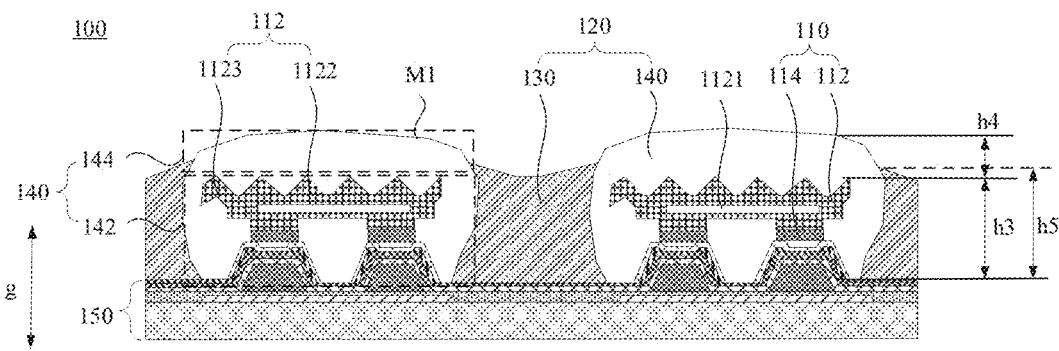
FIG. 3A is a structural diagram of yet another display panel, in accordance with some embodiments.
Figure 3B:
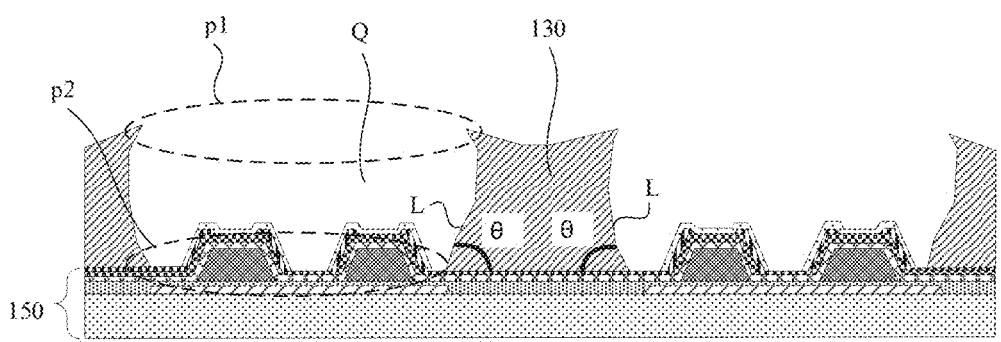
FIG. 3B is a structural diagram of a driving backplane and a light-shielding pattern, in accordance with some embodiments.
Figure 3C:
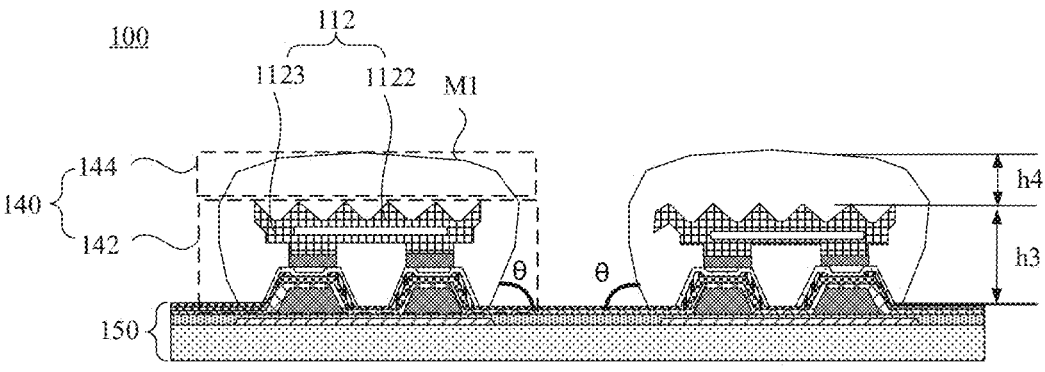
FIG. 3C is a structural diagram of a driving backplane, a light-emitting device, and an encapsulation portion, in accordance with some embodiments.

FIG. 3A is a structural diagram of another display panel, in accordance with some embodiments. FIG. 3B is a structural diagram of a driving backplane and a light-shielding pattern, in accordance with some embodiments. FIG. 3C is a structural diagram of a driving backplane, a light-emitting device, and an encapsulation portion, in accordance with some embodiments.

Based on this, as shown in FIG. 3A, in the embodiments provided by the present disclosure, the display panel 100 further includes an encapsulation structure 120. That is, the display panel 100 includes a driving backplane 150, a plurality of light-emitting devices 110 and the encapsulation structure 120.

The plurality of light-emitting devices 110 are located on the first side of the driving backplane 150, and the plurality of light-emitting devices 110 are arranged at intervals one another. The light-emitting device 110 includes a device main body 112 and device pins 114. The device main body 112 includes a light-emitting portion 1121, and the device pins 114 are electrically connected to the driving backplane 150.

It can be understood that the light-emitting device 110 and the driving backplane 150 have been illustrated in the above-mentioned embodiments of the present disclosure, and details are not repeated here. The encapsulation structure 120 will be exemplarily described below.

In some examples, as shown in FIG. 3A, the encapsulation structure 120 is located on the first side of the driving backplane 150. That is, the encapsulation structure 120 and the plurality of light-emitting devices 110 are located on the same side of the driving backplane 150.

As shown in FIG. 3A, the encapsulation structure 120 includes a light-shielding pattern 130 and a plurality of encapsulation portions 140.

It can be understood that, the light-shielding pattern (also referred to as a black matrix, abbreviated as BM) 130 is used to block light. In some examples, the material of the light-shielding pattern 130 may be a black organic material for playing a role of blocking light. For example, carbon powder and graphite can be added to a transparent organic material to form the black organic material. In some examples, the light-shielding pattern 130 is a black photoresist.

As shown in FIGS. 3A and 3B, the light-shielding pattern 130 has a plurality of accommodation regions Q, and an accommodation region Q exposes at least one light-emitting device 110.

It can be understood that the accommodation region Q is an accommodation hole penetrating through the light-shielding pattern 130 in the thickness direction of the driving backplane 150. The plurality of accommodation regions Q may be the same or different in shape.

In some examples, the accommodation region Q exposes a single light-emitting device 110. In some other examples, the accommodation region Q exposes two, three or more light-emitting devices 110. In some examples, the black photoresist may be formed by coating, and then the black photoresist is patterned, so as to form the light-shielding pattern 130 having the accommodation regions Q.

In some examples, as shown in FIG. 3B, the accommodation region Q has a top opening P1 through which the light emitted by the light-emitting device 110 may exit. For example, shapes and areas of the top openings P1 of the plurality of accommodation regions Q are the same or approximately the same.

As shown in FIG. 3A, at least part of the encapsulation portion 140 is located in the accommodation region Q and covers the light-emitting device 110.

It can be understood that the encapsulation portion 140 can play a role of protecting the light-emitting device 110. For example, as shown in FIG. 3A, the encapsulation portion 140 can not only cover the main body structure 1122 but also cover the adherent structure 1123.

In some examples, as shown in FIG. 3A, part of an outer surface of the encapsulation portion 140 is fit to an inner wall of the accommodation region Q.

It can be understood that the encapsulation portion 140 is made of a transparent material, which may reduce the blocking of the light emitted by the light-emitting portion 1121 by the encapsulation portion 140, improve light utilization efficiency, and improve the light extraction efficiency of the light-emitting device 110.

In some examples, the material of the encapsulation portion 140 includes photoresist, such as any of optically clear (OC) adhesive, polyimide (PI) adhesive or bank (also referred to as step) photoresist. In some other examples, the encapsulation layer 140 may be made of a material having good light transmittance performance.

As shown in FIG. 3A, the light-emitting portion 1121 of at least one light-emitting device 110 is located in the accommodation region Q.

In some examples, the entirety of the at least one light-emitting device 110 is located within the accommodation region Q.

It can be known from the above that the light-shielding pattern 130 is used to block light. In this way, the light-emitting portion 1121 of the at least one light-emitting device 110 is set to be located in the accommodation region Q, so that the light-shielding pattern 130 may block the light exiting from the side of the light-emitting device 110.

It can be understood that the light exiting from the side of the light-emitting device 110 may be the light exiting after passing through the adherent structure 1123, or may be the light exiting from the side of the light-emitting device 110 under the reflection or refraction of the adherent structure 1123, or may be the light exiting from the side caused by other structure(s) (such as the soldering flux 113, not shown in FIG. 3A) in the display panel 100.

That is, by providing the light-shielding pattern 130 and setting the light-emitting portion 1121 of the at least one light-emitting device 110 in the accommodation region Q of the light-shielding pattern 130, it may be possible to improve the side light leakage phenomenon of the light-emitting device 110, improve the uniformity of the light-emitting areas of the plurality of light-emitting devices 110, and reduce the intensity of light irradiated to other light-emitting device(s) 110. As a result, the lateral excitation generated between the two adjacent light-emitting devices 110 may be suppressed, the crosstalk generated between the two adjacent light-emitting devices 110 may be reduced, and the display performance of the display panel 100 may be improved.

In addition, the light-shielding pattern 130 is located on the first side of the driving backplane 150, so that the light-shielding pattern 130 may block the light reflected by the driving backplane 150, reduce the intensity of the reflected light irradiated outside the display panel 100, and improve the display effect of the display panel 100.

In some examples, as shown in FIG. 3A, the accommodation region Q exposes the single light-emitting device 110, so that the light-shielding pattern 130 may be located between any two adjacent light-emitting devices 110, thereby reducing the crosstalk generated between any two adjacent light-emitting devices 110, suppressing the lateral excitation between any two adjacent light-emitting devices 110 and improving the display performance of the display panel 100.

It can be understood that, as shown in FIG. 3A, the light-emitting device 110 is packaged by means of covering the light-emitting device 110 with the encapsulation portion 140, without using the black adhesive film 111 for packaging. Therefore, the light utilization efficiency may be improved, the light extraction efficiency of the light-emitting device 110 may be improved, thereby reducing the power consumption of the display panel 100.

In addition, the encapsulation portion 140 may protect the adherent structure 1123, so as to reduce the risk of the adherent structure 1123 being broken under pressure, thereby reducing the risk of the driving backplane 150 or other structures of the display panel 100 being scratched caused by fragmentation and detachment of the adherent structure 1123, and improving the reliability of the display panel 100. Moreover, the adherent structure 1123 is protected by the encapsulation portion 140, and thus it may also be possible to reduce the risk of the device pins 114 falling off relative to the conductive pad 156 due to the pressure on the adherent structure 1123, thereby improving the reliability of the display panel 100.

In some examples, after cutting the wafer substrate 116, the wafer substrate 116 may be peeled off from the light-emitting device 110, the peeled light-emitting device 110 is soldered onto the driving backplane 150, and then the encapsulation structure 120 (including the light-shielding pattern 130 and the encapsulation portions 140) may be formed to package the light-emitting device 110. Therefore, it may improve the high uniformity of the plurality of light-emitting devices 110, and may also reduce the thickness of the packaged light-emitting device 110, thereby reducing the thickness of the display panel 100.

In some examples, after peeling off the wafer substrate 116, the height of the light-emitting device 110 is about 5 μm.

In some embodiments, as shown in FIG. 3B, the accommodation region Q has a top opening P1 and a bottom opening P2, and the top opening P1 is farther away from the driving backplane 150 than the bottom opening P2. The area of the top opening P1 is larger than the area of the bottom opening P2.

For example, as shown in FIGS. 3A and 3B, the conductive pad 156 may pass through the bottom opening P2, so that the device pins 114 may be soldered onto the conductive pad 156.

It can be understood that the light emitted by the light-emitting portion 1121 can pass through the top opening P1 to irradiate to the outside of the display panel 100. Therefore, the area of the top opening P1 is set to be larger than the area of the bottom opening P2, which may reduce the blocking of the light emitted from the front side of the light-emitting portion 1121 (that is, the side of the light-emitting portion 1121 away from the device pins 114) by the light-shielding pattern 130, increase the luminescence radiation angle (i.e., an angle between two light rays at the furthest edge in the light rays exiting through the top opening P1) of the light-emitting device 110, increase the intensity of the light exiting through the top opening P1 and increase the light extraction efficiency of the light-emitting device 110. Therefore, the light utilization efficiency may be improved, and the power consumption of the display panel 100 may be reduced.

In some examples, by setting the area of the top opening P1 to be larger than the area of the bottom opening P2, it may reduce the blocking of the light emitted from the front side of the light-emitting portion 1121 (that is, the side of the light-emitting portion 1121 away from the device pins 114) by the light-shielding pattern 130, so that the luminescence radiation angle of the light-emitting device 110 located in the accommodation region Q may reach 115°.

In some examples, the shapes of the top openings P1 of the plurality of accommodation regions Q are the same or approximately the same, and the areas of the top openings P1 of the plurality of accommodation regions Q are the same or approximately the same. The shapes of the bottom openings P2 of the plurality of accommodation regions Q are the same or approximately the same, and the areas of the bottom openings P2 of the plurality of accommodation regions Q are the same or approximately the same.

In some examples, the accommodation region Q may be in the shape of an inverted cone frustum or approximately an inverted cone frustum, a region surrounded by the top opening P1 is the lower bottom of the cone frustum, and a region surrounded by the bottom opening P2 is the upper bottom of the cone frustum. In some other examples, the accommodation region Q may have another shape.

In some embodiments, as shown in FIG. 3B, the accommodation region Q has a side wall L. There is a first included angle 3 between the side wall L and the surface of the light-shielding pattern 130 proximate to the driving backplane 150, and the first included angle θ is an acute angle.

It can be understood that, in some examples, at least part of the encapsulation portion 140 is located in the accommodation region Q, and part of the outer surface of the encapsulation portion 140 is attached to the inner wall of the accommodation region Q. In this way, as shown in FIG. 3C, there is also a first included angle θ between a side wall surface of the encapsulation portion 140 and the driving backplane 150.

It can be understood that the first included angle θ is set to be the acute angle, so that the area of the top opening P1 of the accommodation region Q may be larger than the area of the bottom opening P2 of the accommodation region Q, thereby reducing the blocking of the light emitted from the front side of the light-emitting portion 1121 (that is, the side of the light-emitting portion 1121 away from the device pins 114) by the light-shielding pattern 130, increasing the luminescence radiation angle of the light-emitting device 110, increase the intensity of the light exiting through the top opening P1 and increase the light extraction efficiency of the light-emitting device 110. Therefore, the light utilization efficiency may be improved, and the power consumption of the display panel 100 may be reduced.

It can be understood that the first included angle θ is greater than 0° and less than 90°. For example, the first included angle θ may be 88°, 85°, 82°, 80° or 75°.

Figure 4A:
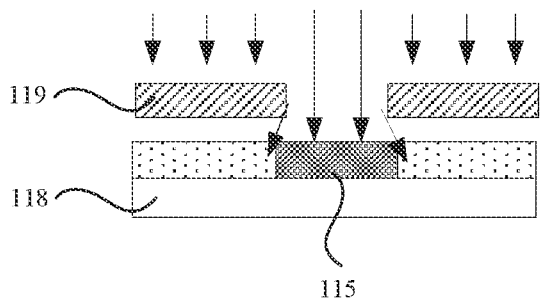
FIG. 4A is a structural diagram of a negative optically clear adhesive, in accordance with some embodiments.
Figure 4B:
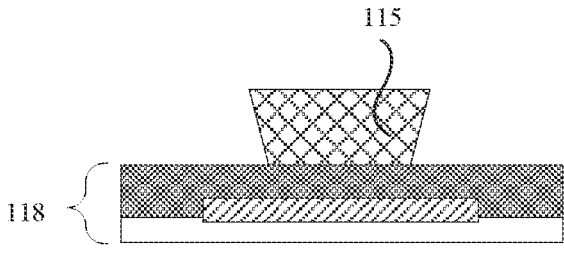
FIG. 4B is a structural diagram of another negative optically clear adhesive, in accordance with some embodiments.
Figure 4C:
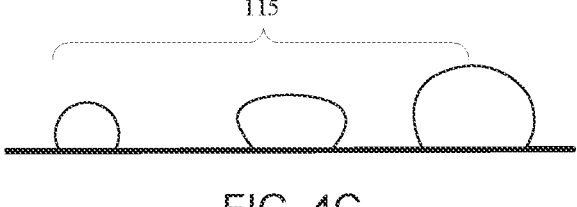
FIG. 4C is a structural diagram of yet another negative optically clear adhesive, in accordance with some embodiments.
Figure 4D:
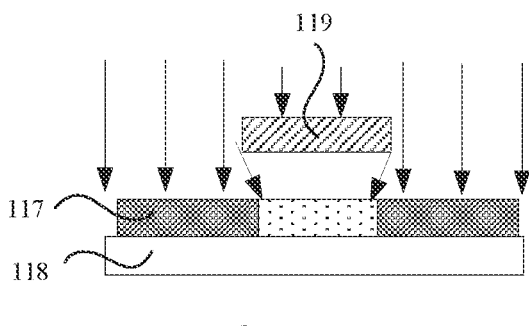
FIG. 4D is a structural diagram of a positive optically clear adhesive, in accordance with some embodiments.
Figure 4E:
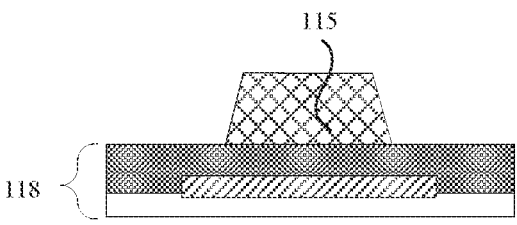
FIG. 4E is a structural diagram of another positive optically clear adhesive, in accordance with some embodiments.

FIG. 4A is a structural diagram of a negative OC adhesive, in accordance with some embodiments. FIG. 4B is a structural diagram of another negative OC adhesive, in accordance with some embodiments. FIG. 4C is a structural diagram of yet another negative OC adhesive, in accordance with some embodiments. FIG. 4D is a structural diagram of a positive OC adhesive, in accordance with some embodiments. FIG. 4E is a structural diagram of another positive OC adhesive, in accordance with some embodiments.

Referring to FIGS. 4A to 4E, the method of manufacturing the encapsulation portions 140 and the light-shielding pattern 130 will be exemplarily described below.

In some examples, the negative photoresist may be exposed, developed, and cleaned, so that the negative photoresist is patterned to form the encapsulation portion 140. The side wall surface of the encapsulation portion 140 and the driving backplane 150 have the first angle θ therebetween. For example, the negative photoresist may be the negative OC adhesive 115.

In some examples, as shown in FIGS. 4A and 4B, the base 118 may be coated with the negative OC adhesive 115, and the negative OC adhesive 115 is illuminated under the blocking of a mask 119, and then is developed and cleaned, so that the negative OC adhesive 115 may be patterned to form the inverted cone frustum structure or approximately the inverted cone frustum structure.

It can be understood that the cone frustum has an upper bottom surface and a lower bottom surface, the upper bottom surface is parallel to the lower bottom surface, and the area of the upper bottom surface is smaller than that of the lower bottom surface. The inverted cone frustum means that the upper bottom surface is closer to the base 118 than the lower bottom surface.

In some examples, as shown in FIG. 4C, after the negative OC adhesive 115 is patterned, the negative OC adhesive 115 may be heated by baking. By controlling the heating time, heating temperature, and the curve of the temperature changing with time, the negative OC adhesive 115 may be formed into various shapes to meet different use requirements.

For example, after forming the plurality of encapsulation portions 140, the black photoresist may be filled between the plurality of encapsulation portions 140, so as to form the light-shielding pattern 130.

In some examples, the positive photoresist may be exposed, developed, and cleaned, so that the positive photoresist is patterned to form the light-shielding pattern 130 with the accommodation regions Q. There may be the first angle θ between the side wall L of the light-shielding pattern 130 and the surface of the light-shielding pattern 130 proximate to the driving backplane 150. For example, the positive photoresist may be the positive OC adhesive 117.

In some examples, as shown in FIGS. 4D and 4E, the base 118 may be coated with the positive OC adhesive 117, and the positive OC adhesive 117 is illuminated under the blocking of a mask 119, and then developed and cleaned, so that the positive OC adhesive 117 may be patterned to form the upright cone frustum or approximately the upright cone frustum.

It can be understood that the cone frustum has an upper bottom surface and a lower bottom surface, the upper bottom surface is parallel to the lower bottom surface, and the area of the upper bottom surface is smaller than that of the lower bottom surface. The upright cone frustum means that the upper bottom surface is farther away from the base 118 than the lower bottom surface.

In some embodiments, the first included angle θ is less than or equal to 75°.

Such an arrangement may increase the area of the top opening P1, reduce the blocking of the light emitted from the front side of the light-emitting portion 1121 by the light-shielding pattern 130, increase the luminescence radiation angle of the light-emitting device 110, increase the intensity of light exiting through the top opening P1, and increase the light extraction efficiency of the light-emitting device 110. Therefore, the light utilization efficiency may be improved, and the power consumption of the display panel 100 may be reduced.

In some examples, the first included angle θ may be 70°, 65°, 60°, 55°, or the like.

In some embodiments, as shown in FIG. 3A, in the thickness direction of the driving backplane 150 (shown by the direction of the arrow g in FIG. 3A), an end surface of the encapsulation portion 140 away from the driving backplane 150 is higher than an end surface of the light-shielding pattern 130 away from the driving backplane 150. In addition, the end surface of the encapsulation portion 140 away from the driving backplane 150 is a first curved surface M1, and the first curved surface M1 is convex in a direction away from the driving backplane 150.

It can be understood that, in the thickness direction of the driving backplane 150, the end surface of the encapsulation portion 140 away from the driving backplane 150 is higher than the end surface of the light-shielding pattern 130 away from the driving backplane 150, which may prevent the light-shielding pattern 130 from covering a side of the encapsulation portion 140 away from the driving backplane 150, so that the light extraction efficiency of the light-emitting device 110 may be improved, the light utilization efficiency may be improved, and the power consumption of the display panel 100 may be reduced. Moreover, preventing the light-shielding pattern 130 from covering the side of the encapsulation portion 140 away from the driving backplane 150 may also improve the uniformity of the light extraction efficiency of the plurality of light-emitting devices 110, thereby improving the brightness uniformity of the plurality of sub-pixels 101.

In addition, in the thickness direction of the driving backplane 150, the end surface of the encapsulation portion 140 away from the driving backplane 150 is higher than the end surface of the light-shielding pattern 130 away from the driving backplane 150. In a case where an external force is applied to the display panel 100, the encapsulation portion 140 may play a role of supporting, so as to protect the light-emitting device 110 and the light-shielding pattern 130, thereby reducing the risk of damage to the light-emitting device 110 and the light-shielding pattern 130.

It can be understood that, as shown in FIG. 3A, the end surface of the encapsulation portion 140 away from the driving backplane 150 is set as the first curved surface M1, and the first curved surface M1 is convex in the direction away from the driving backplane 150, so that the first curved surface M1 may play a role of gathering the light, reduce the intensity of light irradiated to other light-emitting device(s) 110, thereby reducing the crosstalk generated between two adjacent light-emitting devices 110, suppressing the lateral excitation generated between the two adjacent light-emitting devices 110, and improving the display performance of the display panel 100.

In some examples, the encapsulation layer 140 may be in a shape of an approximate mushroom.

In some other examples, the end surface of the encapsulation portion 140 away from the driving backplane 150 may be a plane or approximately a plane. Such an arrangement may reduce the influence of the encapsulation portion 140 on the light emitted by the light-emitting portion 1121 and improve the display performance of the display panel 100.

In some embodiments, as shown in FIG. 3A, the encapsulation portion 140 includes a first part of the encapsulation portion 142 and a second part of the encapsulation portion 144, and the first part of the encapsulation portion 142 is closer to the driving backplane 150 than the second part of the encapsulation portion 144. The first part of the encapsulation portion 142 surrounds the light-emitting device 110, and an end surface of the first part of the encapsulation portion 142 away from the driving backplane 150 is flush with an end surface of the light-emitting device 110 away from the driving backplane 150. The second part of the encapsulation portion 144 is located on a side of the first part of the encapsulation portion 142 away from the driving backplane 150, and covers the first part of the encapsulation portion 142 and the light-emitting device 110.

There is a third distance h3 between the end surface of the first part of the encapsulation portion 142 away from the driving backplane 150 and the driving backplane 150. There is a fourth distance h4 between an end surface of the second part of the encapsulation portion 144 proximate to the first part of the encapsulation portion 142 and an end surface of the second part of the encapsulation portion 144 away from the first part of the encapsulation portion 142. There is a fifth distance h5 between the end surface of the light-shielding pattern 130 away from the driving backplane 150 and the driving backplane 150.

The fifth distance h5 is greater than or equal to the third distance h3 and less than or equal to a sum of 50% of the fourth distance h4 and the third distance h3.

It can be understood that, as shown in FIG. 3A, the end surface of the first part of the encapsulation portion 142 away from the driving backplane 150 may be approximately or completely flush with the end surface of the light-emitting device 110 away from the driving backplane 150.

In some examples, the wafer substrate 116 is a patterned sapphire substrate (PSS). That is, the surface of the sapphire substrate proximate to the N-type doped semiconductor 1125 has a pattern, so that the surface of the sapphire substrate proximate to the N-type doped semiconductor 1125 is uneven, so as to reduce the defect density of the sapphire substrate, improve the quality of the sapphire substrate, thereby improving the light extraction efficiency of the light-emitting device 110.

It can be understood that, before packaging the light-emitting device 110, the wafer substrate 116 needs to be peeled off. In this way, as shown in FIGS. 2G to 2J, the surface of the device main body 112 away from the device pins 114 (the surface of the N-type doped semiconductor 1125 away from the device pins 114) may form, for example, a honeycomb structure 1126. Thus, as shown in FIG. 3A, the surface of the device main body 112 away from the device pins 114 is uneven.

Therefore, the second part of the encapsulation portion 144 is located on the side of the first part of the encapsulation portion 142 away from the driving backplane 150, and the second part of the encapsulation portion 144 covers the first part of the encapsulation portion 142 and the light-emitting device 110, so that the encapsulation portion 140 (including the first part of the encapsulation portion 142 and the second part of the encapsulation portion 144) may cover the honeycomb structure 1126, so as to improve the encapsulation and protection effect of the encapsulation portion 140 on the light-emitting device 110.

In some examples, the first part of the encapsulation portion 142 and the second part of the encapsulation portion 144 are integrally formed. In some other examples, the first part of the encapsulation portion 142 may be formed firstly, and then the second part of the encapsulation portion 144 is formed on the side of the first part of the encapsulation portion 142 away from the driving backplane 150. In this case, there may be a certain angle between the side wall surface of the first part of the encapsulation portion 142 and the side wall surface of the second part of the encapsulation portion 144.

As shown in FIG. 3A, there is the third distance h3 between the end surface of the first part of the encapsulation portion 142 away from the driving backplane 150 and the driving backplane 150, there is the fourth distance h4 between the end surface of the second part of the encapsulation portion 144 proximate to the first part of the encapsulation portion 142 and the end surface of the second part of the encapsulation portion 144 away from the first part of the encapsulation portion 142.

It can be understood that in a case where the end surface of the encapsulation portion 140 away from the driving backplane 150 is an uneven curved surface (e.g., the first curved surface M1), the end surface of the second part of the encapsulation portion 144 proximate to the first part of the encapsulation portion 142 and the end surface of the second part of the encapsulation portion 144 away from the first part of the encapsulation portion 142 may have a plurality of distances therebetween.

In this case, in some examples, the fourth distance h4 is an average of the maximum distance and the minimum distance between the end surface of the second part of the encapsulation portion 144 proximate to the first part of the encapsulation portion 142 and the end surface of the second part of the encapsulation portion 144 away from the first part of the encapsulation portion 142.

In some other examples, the fourth distance h4 is the maximum distance between the end surface of the second part of the encapsulation portion 144 proximate to the first part of the encapsulation portion 142 and the end surface of the second part of the encapsulation portion 144 away from the first part of the encapsulation portion 142 (as shown in FIG. 3A).

There is the fifth distance h5 between the end surface of the light-shielding pattern 130 away from the driving backplane 150 and the driving backplane 150. Moreover, the fifth distance h5 is greater than or equal to the third distance h3 and less than or equal to the sum of 50% of the fourth distance h4 and the third distance h3. That is, as shown in FIG. 3A, the end surface of the light-shielding pattern 130 away from the driving backplane 150 may be located on the peripheral side of the second part of the encapsulation portion 144.

In some examples, as shown in FIG. 3A, the end surface of the light-shielding pattern 130 away from the driving backplane 150 has the curved surface structure, that is, the end surface of the light-shielding pattern 130 away from the driving backplane 150 and the driving backplane 150 have a plurality of distances therebetween.

In this case, in some examples, the fifth distance h5 is an average of the maximum distance and the minimum distance between the end surface of the light-shielding pattern 130 away from the driving backplane 150 and the driving backplane 150.

In some other examples, the fifth distance h5 is the maximum distance between the end surface of the light-shielding pattern 130 away from the driving backplane 150 and the driving backplane 150 (as shown in FIG. 3A).

It can be seen from the above that the driving backplane 150 includes the substrate 1524, the first insulating layer 1521, the second insulating layer 1522, the third insulating layer 1523, the circuit traces 1525, the conductive layer 1526 and the like.

In the embodiments of the present disclosure, considering the first part of the encapsulation portion 142 as an example, the distance between the end surface of the first part of the encapsulation portion 142 away from the driving backplane 150 and the driving backplane 150 is the distance between the end surface of the first part of the encapsulation portion 142 away from the driving backplane 150 and a portion, not covering the protruding portion 1527, of a film layer (e.g., the third insulating layer 1523 in FIG. 2E) in the driving backplane 150 farthest away from the substrate 1524.

It can be understood that the first part of the encapsulation portion 142 surrounds the light-emitting device 110, that is, the first part of the encapsulation portion 142 may surround the light-emitting portion 1121 of the light-emitting device 110. Therefore, the fifth distance h5 is set to be greater than or equal to the third distance h3, so that the light-emitting portion 1121 can be located within the accommodation region Q formed by the light-shielding pattern 130. As a result, the light-shielding pattern 130 may block the side light leakage of the light-emitting device 110, reduce the crosstalk generated between the two adjacent light-emitting devices 110, and suppress the lateral excitation between the two adjacent light-emitting devices 110.

Moreover, setting the fifth distance h5 to be less than or equal to the sum of 50% of the fourth distance h4 and the third distance h3 may reduce the blocking of the light emitted from the front side of the light-emitting portion 1121 by the light-shielding pattern 130 on the basis of suppressing the lateral excitation between the two adjacent light-emitting devices 110, increase the light extraction efficiency of the light-emitting device 110, improve the light utilization efficiency, and reduce the power consumption of the display panel 100.

In some examples, the fifth distance h5 is equal to the sum of 50% of the fourth distance h4 and the third distance h3.

In some embodiments, as shown in FIG. 3C, the fourth distance h4 is greater than or equal to 30% of the third distance h3 and less than or equal to twice the third distance h3.

It can be seen from the above that there is the third distance h3 between the end surface of the first part of the encapsulation portion 142 away from the driving backplane 150 and the driving backplane 150. There is the fourth distance h4 between the end surface of the second part of the encapsulation portion 144 proximate to the first part of the encapsulation portion 142 and the end surface of the second part of the encapsulation portion 144 away from the first part of the encapsulation portion 142. The first part of the encapsulation portion 142 surrounds the light-emitting device 110, and the end surface of the first part of the encapsulation portion 142 away from the driving backplane 150 is flush with the end surface of the light-emitting device 110 away from the driving backplane 150. The second part of the encapsulation portion 144 is located on the side of the first part of the encapsulation portion 142 away from the driving backplane 150, and covers the first part of the encapsulation portion 142 and the light-emitting device 110.

In this way, the fourth distance h4 is set to be greater than or equal to 30% of the third distance h3, so that the second part of the encapsulation portion 144 may completely cover the honeycomb structure 1126 and the adherent structure 1123 of the light-emitting device 110, and the encapsulation portion 140 (including the first part of the encapsulation portion 142 and the second part of the encapsulation portion 144) may have an improved encapsulation and protection effect on the light-emitting device 110.

Moreover, the fourth distance h4 is set to be less than or equal to twice the third distance h3, so as to avoid an increase in the height of the encapsulation portion 140 caused by the excessive thickness of the fourth distance h4, which results in an increase in the thickness of the display panel 100. That is, setting the fourth distance h4 to be less than or equal to twice the third distance h3 may facilitate the thinning of the display panel 100.

In some examples, the fourth distance h4 is equal to 30%, 40%, 50% or 60% of the third distance h3.

In some examples, the fourth distance h4 is equal to 30% of the third distance h3. The fifth distance h5 is equal to the sum of 50% of the fourth distance h4 and the third distance h3. That is, the fifth distance h5 is equal to 1.15 times h3.

Figure 5A:
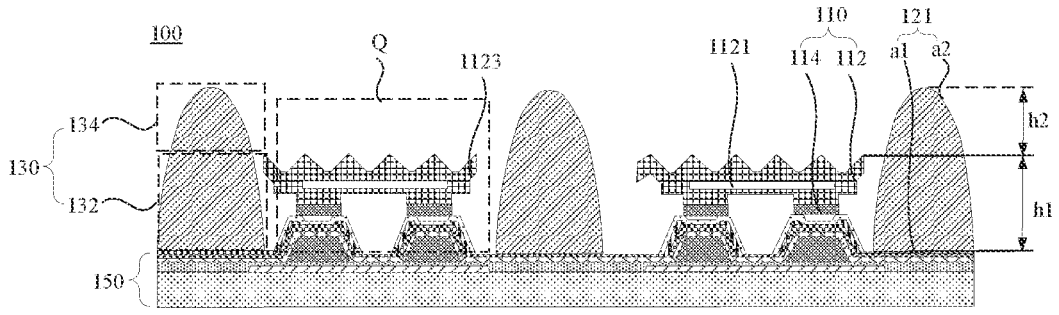
FIG. 5A is a structural diagram of a driving backplane, a light-emitting device and a light-shielding pattern, in accordance with some embodiments.
Figure 5B:
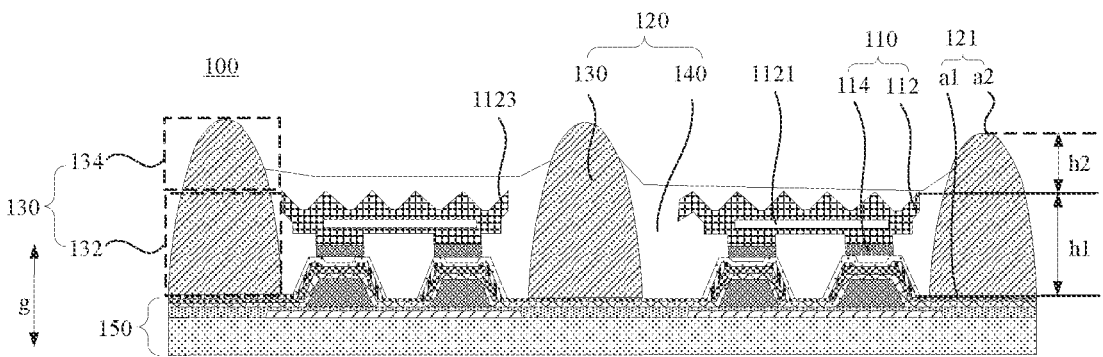
FIG. 5B is a structural diagram of yet another display panel, in accordance with some embodiments.

FIG. 5A is a structural diagram of a driving backplane, a light-emitting device and a light-shielding pattern, in accordance with some embodiments. FIG. 5B is a structural diagram of another display panel, in accordance with some embodiments.

In some embodiments, as shown in FIGS. 5A and 5B, the shape of the light-shielding pattern 130 in a longitudinal section includes a semi-ellipse 121, and the longitudinal section is parallel to the thickness direction of the driving backplane 150. The semi-ellipse 121 has a first side a1 and a second side a2, and both ends of the first side a1 are connected to both ends of the second side a2. The first side a1 is provided proximate to the driving backplane 150, and the second side a2 is convex in a direction away from the driving backplane 150.

It can be understood that, as shown in FIGS. 5A and 5B, the shape of the light-shielding pattern 130 in the longitudinal section may include a semi-ellipse 121 or an approximate semi-ellipse 121. For example, in a case where the accommodation region Q exposes a single light-emitting device 110, the semi-ellipse 121 is located between two adjacent light-emitting devices 110.

It can be understood that the first side a1 of the semi-ellipse 121 is provided proximate to the driving backplane 150, and the second side a2 is convex in the direction away from the driving backplane 150, so that the area of the top opening P1 of the accommodation region Q may be larger than the area of the bottom opening P2 of the accommodation region Q. Therefore, the blocking of the light emitted by the light-emitting portion 1121 by the light-shielding pattern 130 may be reduced, the luminescence radiation angle of the light-emitting device 110 may increase, the intensity of light exiting through the top opening P1 may increase, and the light extraction efficiency of the light-emitting device 110 may increase, and thus the light utilization efficiency may be improved, and the power consumption of the display panel 100 may be reduced.

It can be understood that in a case where the shape of the light-shielding pattern 130 in the longitudinal section includes a plurality of semi-ellipses 121, the shapes of the plurality of semi-ellipses 121 may be the same or different.

In some examples, as shown in FIGS. 5A and 5B, the encapsulation portion 140 may be formed in the accommodation region Q by adopting inkjet printing (also referred to as ink jet printer, abbreviated as IJP). For example, the encapsulation portion 140 formed by inkjet printing may atomize the light emitted by the light-emitting portion 1121, so as to improve the brightness uniformity of the sub-pixel 101.

The shape of the light-shielding pattern 130 in the longitudinal section includes the semi-ellipse 121, which may improve the flexibility of the light-shielding pattern 130 on the basis of increasing the light extraction efficiency of the light-emitting device 110, so as to meet different use requirements.

Figure 5C:
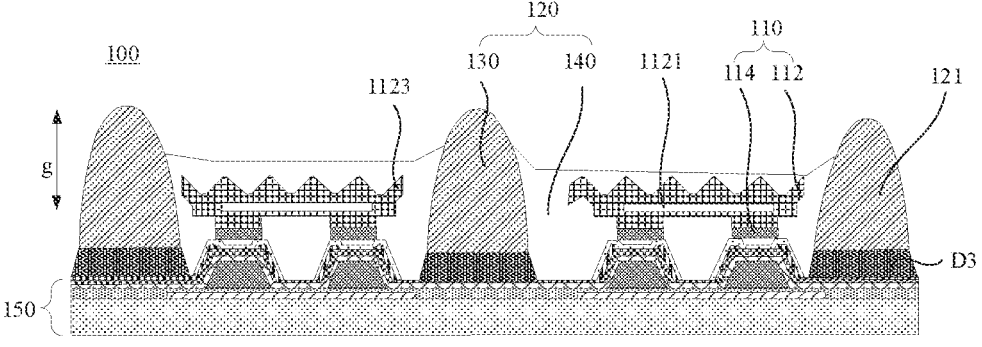
FIG. 5C is a structural diagram of yet another display panel, in accordance with some embodiments.

FIG. 5C is a structural diagram of yet another display panel, in accordance with some embodiments.

In some examples, as shown in FIG. 5C, the shape of the light-shielding pattern 130 in a longitudinal section may include a semi-ellipse 121 and a third trapezoid D3, and the semi-ellipse 121 is located on a side of the third trapezoid D3 away from the driving backplane 150. For example, an upper base of the third trapezoid D3 is farther away from the driving backplane 150 than a lower base. In some examples, an angle between the lower base and a leg of the third trapezoid D3 is less than or equal to 75°.

Such arrangement may reduce the blocking of the light emitted from the front of the light-emitting portion 1121 by the light-shielding pattern 130, increase the intensity of the light exiting through the top opening P1, reduce the influence of the light-shielding pattern 130 on the luminescence radiation angle of the light-emitting device 110, improve the light utilization efficiency, improve the light extraction efficiency of the light-emitting device 110, and reduce the power consumption of the display panel 100.

In some examples, the included angle between the lower base and the leg of the third trapezoid D3 may be 70°, 65°, 60° or 55°.

It can be seen from the above that, in some embodiments, as shown in FIG. 3A, in the thickness direction of the driving backplane 150 (shown by the direction of the arrow g in FIG. 3A), the end surface of the encapsulation portion 140 away from the driving backplane 150 is higher than the end surface of the light-shielding pattern 130 away from the driving backplane 150. In addition, the end surface of the encapsulation portion 140 away from the driving backplane 150 is the first curved surface M1, and the first curved surface M1 is convex in the direction away from the driving backplane 150.

In some other embodiments, as shown in FIGS. 5B and SC, in the thickness direction of the driving backplane 150 (shown by the direction of the arrow g in FIGS. 5B and SC), the end surface of the encapsulation portion 140 away from the driving backplane 150 is lower than the end surface of the light-shielding pattern 130 away from the driving backplane 150. In addition, at least a central region of the end surface of the encapsulation portion 140 away from the driving backplane 150 is a plane.

It can be understood that, as shown in FIGS. 5B and SC, in the thickness direction of the driving backplane 150 (shown by the direction of the arrow g in FIGS. 5B and 5C), the end surface of the encapsulation portion 140 away from the driving backplane 150 is lower than the end surface of the light-shielding pattern 130 away from the driving backplane 150, so that both the light-emitting device 110 and the encapsulation portion 140 may be located in the accommodation region Q. Therefore, the improvement effect of the light-shielding pattern 130 on the side light leakage of the light-emitting device 110 may be improved, the crosstalk generated between the two adjacent light-emitting devices 110 may be reduced, the lateral excitation between the two adjacent light-emitting devices 110 may be suppressed, and thus the display performance of the display panel 100 may be improved.

In addition, in the thickness direction of the driving backplane 150 (shown by the direction of the arrow g in FIGS. SB and SC), the end surface of the encapsulation portion 140 away from the driving backplane 150 is lower than the end surface of the light-shielding pattern 130 away from the driving backplane 150. In a case where an external force is applied to the display panel 100, the light-shielding pattern 130 may play a role of supporting, so that the light-shielding pattern 130 may protect the light-emitting device 110 and the encapsulation portion 140, thereby reducing the risk of damage to the light-emitting device 110 and the encapsulation portion 140.

It can be understood that at least the central region of the end surface of the encapsulation portion 140 away from the driving backplane 150 is the plane or approximately the plane, which may reduce the refraction of the light emitted by the light-emitting portion 1121 by the encapsulation portion 140, that is, reduce the influence on the light emitted by the light-emitting portion 1121 by the encapsulation portion 140. Therefore, the display performance of the display panel 100 may be improved.

In some embodiments, as shown in FIGS. 5A and 5B, the light-shielding pattern 130 includes a first part of the light-shielding pattern 132 and a second part of the light-shielding pattern 134. The first part of the light-shielding pattern 132 is closer to the driving backplane 150 than the second part of the light-shielding pattern 134. The end surface of the first part of the light-shielding pattern 132 away from the driving backplane 150 is flush with the end surface of the light-emitting device 110 away from the driving backplane 150. The second part of the light-shielding pattern 134 is located on a side of the first part of the light-shielding pattern 132 away from the driving backplane 150.

There is a first distance h1 between the end surface of the first part of the light-shielding pattern 132 away from the driving backplane 150 and the driving backplane 150. There is a second distance h2 between the end surface of the second part of the light-shielding pattern 134 proximate to the first part of the light-shielding pattern 132 and the end surface of the second part of the light-shielding pattern 134 away from the first part of the light-shielding pattern 132.

The second distance h2 is greater than or equal to 30% of the first distance h1 and less than or equal to twice the first distance h1.

It can be understood that the end surface of the first part of the light-shielding pattern 132 away from the driving backplane 150 may be approximately flush with or completely flush with the end surface of the light-emitting device 110 away from the driving backplane 150.

It can be understood that since the end surface of the first part of the light-shielding pattern 132 away from the driving backplane 150 is flush with the end surface of the light-emitting device 110 away from the driving backplane 150, the first part of the light-shielding pattern 132 may block the side light leakage of the light-emitting device 110, suppress the lateral excitation between two adjacent light-emitting devices 110, and reduce the crosstalk generated between the two adjacent light-emitting devices 110.

Setting the second distance h2 to be greater than or equal to 30% of the first distance h1 may improve the blocking effect of the light-shielding pattern 130 on the side light leakage of the light-emitting device 110.

Setting the second distance h2 to be less than or equal to twice the first distance h1 may avoid an excessive height of the light-shielding pattern 130 caused by the excessive height of the second distance h2, which results in an increase in the thickness of the display panel 100. That is, setting the second distance h2 to be less than or equal to twice the first distance h1 may facilitate the thinning of the display panel 100.

In some examples, the second distance h2 may be 30%, 40%, 50%, or 60% of the first distance h1.

In some examples, in a case where the shape of the light-shielding pattern 130 in the longitudinal section includes the semi-ellipse 121, the end surface of the second part of the light-shielding pattern 134 proximate to the first part of the light-shielding pattern 132 and the end surface of the second part of the light-shielding pattern 134 away from the first part of the light-shielding pattern 132 have a plurality of distances therebetween. In this case, the second distance h2 is the distance between the end surface of the second part of the light-shielding pattern 134 proximate to the first part of the light-shielding pattern 132 and the highest point of the second part of the light-shielding pattern 134 in the thickness direction of the driving backplane 150. That is, the second distance h2 is the maximum distance between the end surface of the second part of the light-shielding pattern 134 proximate to the first part of the light-shielding pattern 132 and the end surface of the second part of the light-shielding pattern 134 away from the first part of the light-shielding pattern 132.

In some examples, the first part of the light-shielding pattern 132 and the second part of the light-shielding pattern 134 may be integrally formed. In some other examples, the first part of the light-shielding pattern 132 may be formed firstly, and then the second part of the light-shielding pattern 134 is formed on the side of the first part of the light-shielding pattern 132 away from the driving backplane 150.

Figure 6A:
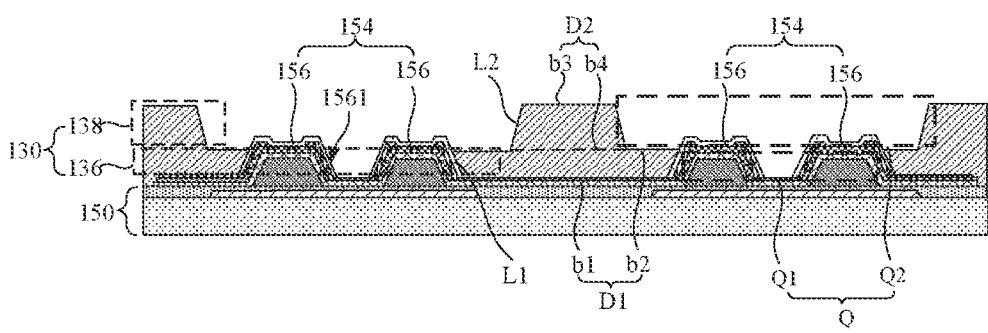
FIG. 6A is a structural diagram of a light-shielding pattern and a driving backplane, in accordance with some embodiments.
Figure 6B:
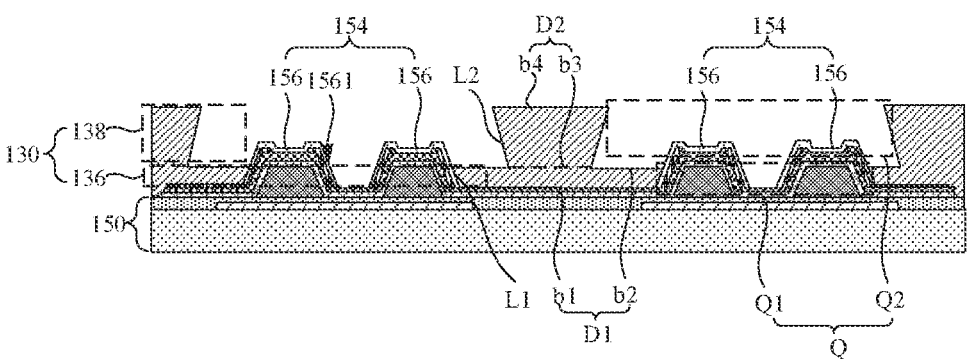
FIG. 6B is a structural diagram of another light-shielding pattern and another driving backplane, in accordance with some embodiments.
Figure 6C:
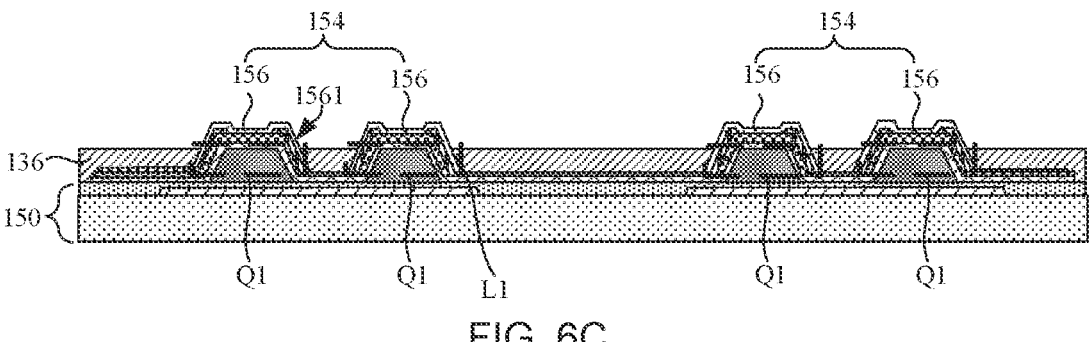
FIG. 6C is a structural diagram of a first light-shielding sub-pattern and a driving backplane, in accordance with some embodiments.
Figure 6D:
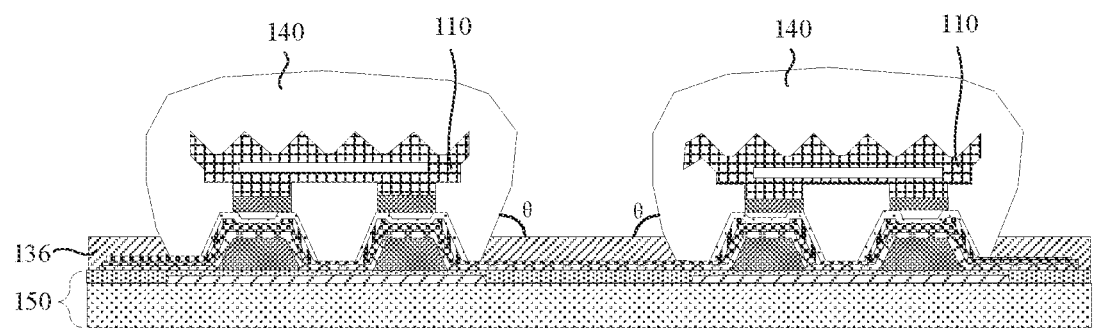
FIG. 6D is a structural diagram of a driving backplane, a first light-shielding sub-pattern, a light-emitting device, and an encapsulation portion, in accordance with some embodiments.
Figure 6E:
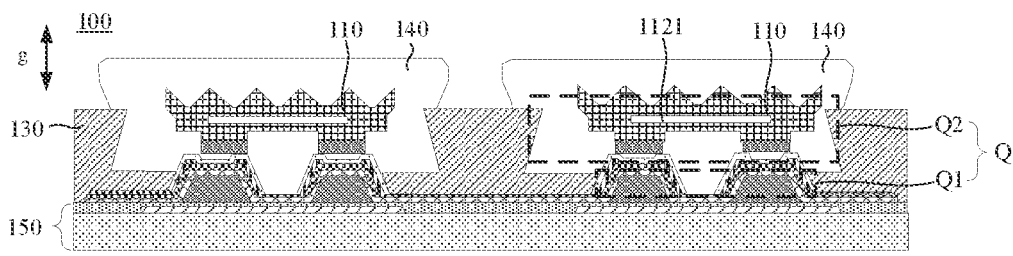
FIG. 6E is a structural diagram of yet another display panel, in accordance with some embodiments.
Figure 6F:
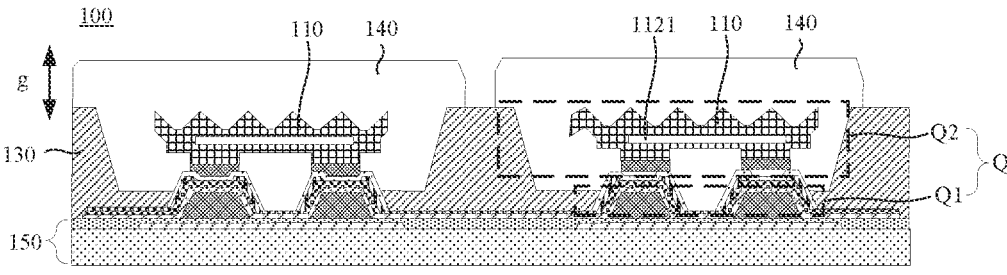
FIG. 6F is a structural diagram of yet another display panel, in accordance with some embodiments.

FIG. 6A is a structural diagram of a light-shielding pattern and a driving backplane, in accordance with some embodiments. FIG. 6B is a structural diagram of a light-shielding pattern and a driving backplane, in accordance with some other embodiments. FIG. 6C is a structural diagram of a first light-shielding sub-pattern and a driving backplane, in accordance with some embodiments. FIG. 6D is a structural diagram of a driving backplane, a first light-shielding sub-pattern, a light-emitting device, and an encapsulation portion, in accordance with some embodiments. FIG. 6E is a structural diagram of yet another display panel, in accordance with some embodiments. FIG. 6F is a structural diagram of yet another display panel, in accordance with some embodiments.

In some embodiments, as shown in FIGS. 6A and 6B, the light-shielding pattern 130 includes a first light-shielding sub-pattern 136 and a second light-shielding sub-pattern 138 that are stacked. The first light-shielding sub-pattern 136 is closer to the driving backplane 150 than the second light-shielding sub-pattern 138.

It can be understood that the materials of the first light-shielding sub-pattern 136 and the second light-shielding sub-pattern 138 may be the same or different, and the shapes of the first light-shielding sub-pattern 136 and the second light-shielding sub-pattern 138 may be the same or different.

In some examples, the first light-shielding sub-pattern 136 and the second light-shielding sub-pattern 138 may be integrally formed.

In the embodiments of the present disclosure, an integrally formed structure refers to a structure that is formed by a single process. It can be understood that, the single process may include multiple manufacturing steps. That is to say, the integrally formed structure may be manufactured by the multiple manufacturing steps.

In some other examples, as shown in FIGS. 6C and 6D, the first light-shielding sub-pattern 136 may be formed on a side of the driving backplane 150 firstly, then the light-emitting device 110 is electrically connected to the driving backplane 150, and the encapsulation portion 140 covering the light-emitting device 110 is formed; as shown in FIGS. 6E and 6F, afterwards the second light-shielding sub-pattern 138 is formed on the side of the first light-shielding sub-pattern 136 away from the driving backplane 150.

In yet some examples, after the first light-shielding sub-pattern 136 is formed, the second light-shielding sub-pattern 138 may be formed on the side of the first light-shielding sub-pattern 136 away from the driving backplane 150, and then the light-emitting device 110 is electrically connected to the driving backplane 150, afterwards the encapsulation portion 140 covering the light-emitting device 110 is formed.

In some examples, as shown in FIGS. 6E and 6F, the accommodation region Q includes a first accommodation sub-region Q1 and a second accommodation sub-region Q2. The first accommodation sub-region Q1 is in communication with the second accommodation sub-region Q2. An orthographic projection of an edge of an opening of the first accommodation sub-region Q1 on the driving backplane 150 falls into a region surrounded by an orthographic projection of an edge of an opening of the second accommodation sub-region Q2 on the driving backplane 150. The first light-shielding sub-pattern 136 includes the first accommodation sub-region Q1, and the second light-shielding sub-pattern 138 includes the second accommodation sub-region Q2.

It can be understood that the first accommodation sub-region Q1 includes two openings, an opening thereof is closer to the driving backplane 150 than the other opening thereof. The second accommodation sub-region Q2 also includes two openings, an opening thereof is closer to the driving backplane 150 than the other opening thereof. An orthographic projection of an edge of any opening of the first accommodation sub-region Q1 on the driving backplane 150 falls into a region surrounded by an orthographic projection of an edge of any opening of the second accommodation sub-region Q2 on the driving backplane 150. The above arrangement may make the accommodation space of the first accommodation sub-region Q1 larger than the accommodation space of the second accommodation sub-region Q2.

It can be understood that the orthographic projection of the edge of the opening of the first accommodation sub-region Q1 on the driving backplane 150 falls into the region surrounded by the orthographic projection of the edge of the opening of the second accommodation sub-region Q2 on the driving backplane 150, which may increase the blocking effect of the first light-shielding sub-pattern 136 on the light reflected by the driving backplane 150, reduce the intensity of the reflected light irradiated outside the display panel 100, and improve the display performance of the display panel 100.

It can be known from the above that the driving backplane 150 includes the backplane main body 152 and the plurality of pad components 154, and the plurality of pad components 154 are electrically connected to the backplane main body 152.

In some examples, as shown in FIGS. 6E and 6F, the pad component 154 passes through the first accommodation sub-region Q1 and is soldered to at least one light-emitting device 110. The light-emitting portion 1121 of the at least one light-emitting device 110 is located in the second accommodation sub-region Q2.

It can be understood that, as shown in FIGS. 6A and 6B, the pad component 154 includes conductive pads 156. The extending surface 1561 of the conductive pad 156 may extend in the direction away from the substrate 1524, so that the pad component 154 may pass through the first accommodation sub-region Q1 and part of the pad component 154 may be located in the second accommodation sub-region Q2. Therefore, the at least one light-emitting device 110 located in the second accommodation sub-region Q2 may be soldered onto the conductive pad 156.

In some examples, as shown in FIGS. 6A and 6B, conductive pads 156 in the pad component 154 pass through the same first accommodation sub-region Q1. In some other examples, as shown in FIG. 6C, a single conductive pad 156 passes through a single first sub-accommodating region Q1.

In some examples, as shown in FIG. 6C, the first light-shielding sub-pattern 136 may be a leveling layer.

In some examples, after the first light-shielding sub-pattern 136 is formed, a semi-elliptical, trapezoidal or other irregular-shaped second light-shielding sub-pattern 138 may be formed on the side of the first light-shielding sub-pattern 136 away from the driving backplane 150.

In some examples, as shown in FIGS. 6E and 6F, the light-emitting portion 1121 of the at least one light-emitting device 110 is located in the second accommodation sub-region Q2, so that the second light-shielding sub-pattern 138 may blocking the side light leakage of the light-emitting device 110, reduce the crosstalk generated between two adjacent light-emitting devices 110, and reduce the lateral excitation generated between the two adjacent light-emitting devices 110.

In some examples, as shown in FIG. 6F, the light-emitting portion 1121 of the light-emitting device 110 is located in the second accommodation sub-region Q2, that is, in the thickness direction of the driving backplane 150 (shown by the direction of the arrow g in FIG. 6F), the end surface of the light-shielding pattern 130 away from the driving backplane 150 is higher than the end surface of the light-emitting device 110 away from the driving backplane 150.

In some other examples, as shown in FIG. 6E, the entirety of the light-emitting device 110 is located in the second accommodation sub-region Q2, that is, in the thickness direction of the driving backplane 150 (shown by the direction of the arrow g in FIG. 6E), the end surface of the light-shielding pattern 130 away from the driving backplane 150 is lower than the end surface of the light-emitting device 110 away from the driving backplane 150.

It can be understood that, the first light-shielding sub-pattern 136 includes the first accommodation sub-region Q1, and the second light-shielding sub-pattern 138 includes the second accommodation sub-region Q2, so that the first accommodation sub-region Q1 and the second accommodation sub-region Q2 may be communicated with each other. Therefore, the conductive pads 156 passing through the first accommodation sub-region Q1 may be electrically connected with the light-emitting device 110 located in the second accommodation sub-region Q2, so that the second light-shielding sub-pattern 138 may block the side light leakage of the light-emitting device 110, suppress the lateral excitation generated between two adjacent light-emitting devices 110, and improve the display effect of the display panel 100.

In some examples, as shown in FIGS. 6A and 6B, the first light-shielding sub-pattern 136 and the second light-shielding sub-pattern 138 may be in the shape of two steps or approximately two steps.

In some embodiments, as shown in FIGS. 6A and 6B, the shape of the first light-shielding sub-pattern 136 in the longitudinal section includes a first trapezoid D1, and the longitudinal section is parallel to the thickness direction of the driving backplane 150. The first trapezoid D1 has a first base b1 and a second base b2, the first base b1 is parallel to the second base b2, and the length of the first base b1 is smaller than the length of the second base b2.

As shown in FIGS. 6A and 6B, in some examples, the first base b1 is closer to the driving backplane 150 than the second base b2.

It can be seen from the above that, in some examples, the protruding portion 1527 of the driving backplane 150 is in the shape of a cone frustum, and the upper bottom surface of the cone frustum is farther away from the substrate 1524 than the lower bottom surface of the cone frustum. Since the conductive pad 156 covers the protruding portion 1527, the first base b1 is set closer to the driving backplane 150 relative to the second base b2, so that the first trapezoid D1 is an inverted trapezoid structure, which may reduce the gap between the first trapezoid D1 and the conductive pad 156, so that the first trapezoid D1 may be fit with the conductive pad 156. As a result, the blocking effect of the first light-shielding sub-pattern 136 on reflected light may be improved, and thus the display performance of the display panel 100 may be improved.

In some other examples, the first base b1 is farther away from the driving backplane 150 than the second base b2.

It can be understood that, in some other examples, the protruding portion 1527 of the driving backplane 150 is in the shape of a cone frustum, and the upper bottom surface of the cone frustum is closer to the substrate 1524 than the lower bottom surface of the cone frustum. Since the conductive pad 156 covers the protruding portion 1527, the first base b1 is set farther away from the driving backplane 150 relative to the second base b2, so that the first trapezoid D1 is an upright trapezoid structure, which may reduce the gap between the first trapezoid D1 and the conductive pad 156, so that the first trapezoid D1 may be fit with the conductive pad 156. As a result, the blocking effect of the first light-shielding sub-pattern 136 on reflected light may be improved, and thus the display performance of the display panel 100 may be improved It can be understood that the shape of the first light-shielding sub-pattern 136 in the longitudinal section includes the first trapezoid D1, the first base b1 of the first trapezoid D1 is closer to the driving backplane 150 than the second base b2, or the first base b1 is farther away from the driving backplane 150 than the second base b2. Therefore, the positional relationship between the first base b1 and the second base b2 of the first trapezoid D1 may be set according to use requirements, thereby improving the flexibility of the light-shielding sub-pattern 136.

In some examples, the first light-shielding sub-pattern 136 includes a plurality of first trapezoids D1, and the plurality of first trapezoids D1 may be the same or different in shape.

It can be seen from the above that, the pad component 154 includes at least two conductive pads 156. The conductive pad 156 includes the extension surface 1561 and the soldering surface 1562, and the extension surface 1561 extends in the direction away from the backplane main body 152. The soldering surface 1562 is connected to the end of the extension surface 1561 away from the backplane main body 152. The device pins 114 are soldered onto the soldering surface 1562.

As shown in FIGS. 6A and 6B, the first accommodation sub-region Q1 has a first sub-side wall L1, and the first sub-side wall L1 is in contact with at least a portion of the extension surface 1561.

It can be understood that the first sub-side wall L1 of the first accommodation sub-region Q1 is a leg of the first trapezoid D1. The first sub-side wall L1 is in contact with at least the portion of the extension surface 1561, so that the first accommodation sub-region Q1 may surround a part of the extension surface 1561.

In some examples, as shown in FIGS. 6A and 6B, the first sub-side wall L1 is in contact with a side of an extension surface 1561 away from another extension surface 1561, that is, the first light-shielding sub-pattern 136 is not located between two conductive pads 156 electrically connected to the same light-emitting device 110. Such arrangement may reduce the influence of the first light-shielding sub-pattern 136 on the conductive pads 156, and improve the reliability of soldering between the device pins 114 and the conductive pads 156.

In some other examples, as shown in FIG. 6C, the first sub-side wall L1 surrounds the extension surface 1561, that is, the first light-shielding sub-pattern 136 is located between two conductive pads 156 electrically connected to the same light-emitting device 110. Such arrangement may improve the blocking effect of the first light-shielding sub-patterns 136 on the light reflected by the driving backplane 150, reduce the intensity of light irradiated outside the display panel 100, and thus improve the display performance of the display panel 100.

It can be understood that, the first sub-side wall L1 is set to be in contact with at least a portion of the extension surface 1561, so that the first light-shielding sub-pattern 136 may cover the driving backplane 150 and expose the soldering surface 1562 of the conductive pad 156. Therefore, on the basis that the first light-shielding sub-pattern 136 does not affect the soldering of the soldering surface 1562 and the device pins 114, the blocking effect of the first light-shielding sub-pattern 136 on the light reflected by the driving backplane 150 may be improved, thereby reducing the intensity of the reflected light irradiated outside the display panel 100, and improve the display effect of the display panel 100.

In some embodiments, as shown in FIGS. 6A and 6B, the shape of the second light-shielding sub-pattern 138 in the longitudinal section includes a second trapezoid D2, and the longitudinal section is parallel to the thickness direction of the driving backplane 150. The second trapezoid D2 has a third base b3 and a fourth base b4, the third base b3 is parallel to the fourth base b4, and the length of the third base b3 is smaller than the length of the fourth base b4.

In some embodiments, as shown in FIG. 6A, the third base b3 is farther away from the driving backplane 150 than the fourth base b4.

It can be understood that, as shown in FIG. 6A, in a case where the third base b3 is farther away from the driving backplane 150 than the fourth base b4, and the first light-shielding sub-pattern 136 and the second light-shielding sub-pattern 138 are of an integrally formed structure, the fourth base b4 is a virtual line segment between the first light-shielding sub-pattern 136 and the second light-shielding sub-pattern 138.

In a case where the first light-shielding sub-pattern 136 and the second light-shielding sub-pattern 138 are formed separately, the fourth base b4 is an edge of a contact surface between the first light-shielding sub-pattern 136 and the second light-shielding sub-pattern 138.

It can be understood that, as shown in FIG. 6A, the third base b3 is set farther away from the driving backplane 150 relative to the fourth base b4, so that the second trapezoid D2 may be an upright trapezoid. In this way, it may be possible to reduce the blocking of the light emitted from the front of the light-emitting portion 1121 by the light-shielding pattern 130, increase the luminescence radiation angle of the light-emitting device 110, increase the intensity of light exiting through the top opening P1, and increase the light extraction efficiency of the light-emitting device 110. Therefore, the light utilization efficiency may be improved, and the power consumption of the display panel 100 may be reduced.

In some other examples, as shown in FIG. 6B, the third base b3 is closer to the driving backplane 150 than the fourth base b4.

It can be understood that, as shown in FIG. 6B, in a case where the third base b3 is closer to the driving backplane 150 than the fourth base b4, and the first light-shielding sub-pattern 136 and the second light-shielding sub-pattern 138 are of an integrally formed structure, the third base b3 is a virtual line segment between the first light-shielding sub-pattern 136 and the second light-shielding sub-pattern 138.

In a case where the first light-shielding sub-pattern 136 and the second light-shielding sub-pattern 138 are formed separately, the third base b3 is an edge of a contact surface between the first light-shielding sub-pattern 136 and the second light-shielding sub-pattern 138.

It can be understood that, as shown in FIG. 6B, the third base b3 is set closer to the driving backplane 150 than the fourth base b4, so that the second trapezoid D2 may be an inverted trapezoid. In this way, it may be possible to improve the blocking effect of the light-shielding pattern 130 on the side light leakage of the light-emitting devices 110, improve the lateral excitation between two adjacent light-emitting devices 110, and improve the display performance of the display panel 100.

It can be understood that the shape of the second light-shielding sub-pattern 138 in the longitudinal section includes the second trapezoid D2, the third base b3 of the second trapezoid D2 is closer to the driving backplane 150 than the fourth base b4, or the third base b3 is farther away from the driving backplane 150 than the fourth base b4. Therefore, the positional relationship between the third base b3 and the fourth base b4 of the second trapezoid D2 may be set according to the use requirements, thereby improving the flexibility of the second light-shielding sub-pattern 138.

In some examples, the second light-shielding sub-pattern 138 includes a plurality of second trapezoids D2, and the plurality of second trapezoids D2 may be the same or different in shape.

Figure 7A:
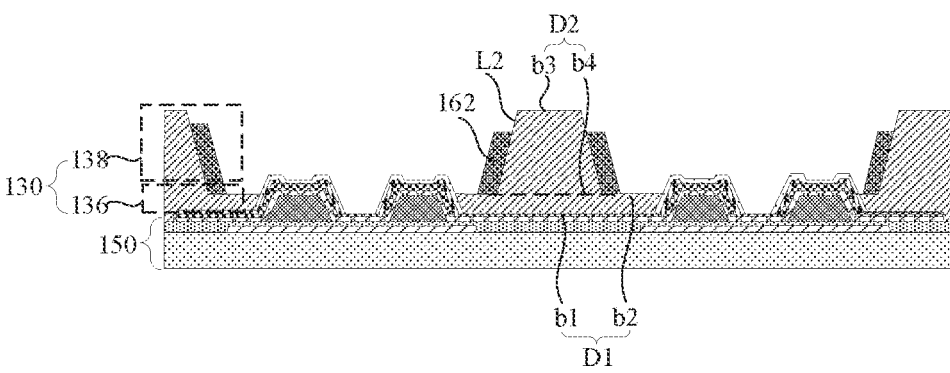
FIG. 7A is a diagram of a position relationship between a reflective layer and a light-shielding pattern, in accordance with some embodiments.
Figure 7B:
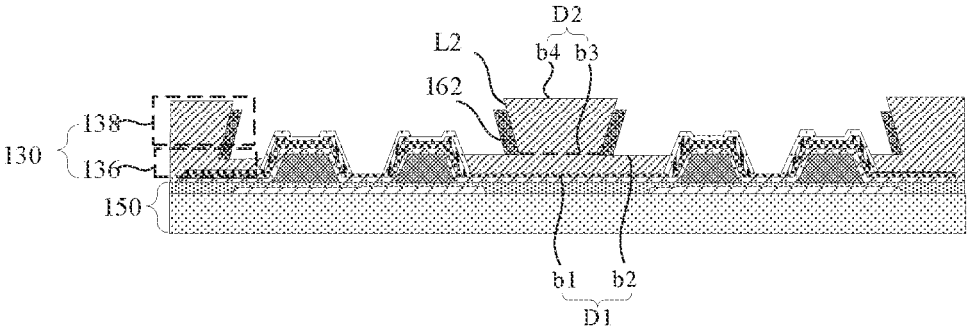
FIG. 7B is a diagram of a position relationship between another reflective layer and another light-shielding pattern, in accordance with some embodiments.
Figure 7C:
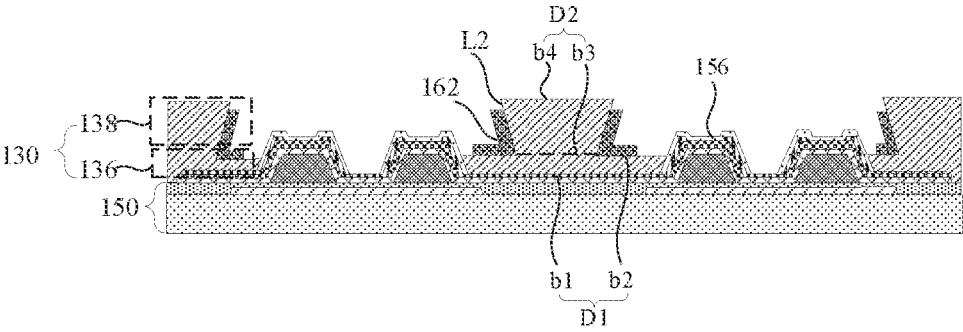
FIG. 7C is a diagram of a position relationship between yet another reflective layer and yet another light-shielding pattern, in accordance with some embodiments.

FIG. 7A is a diagram of a position relationship between a reflective layer and a light-shielding pattern, in accordance with some embodiments. FIG. 7B is a diagram of a position relationship between another reflective layer and another light-shielding pattern, in accordance with some embodiments. FIG. 7C is a diagram of a position relationship between yet another reflective layer and yet another light-shielding pattern, in accordance with some embodiments.

Figure 7D:
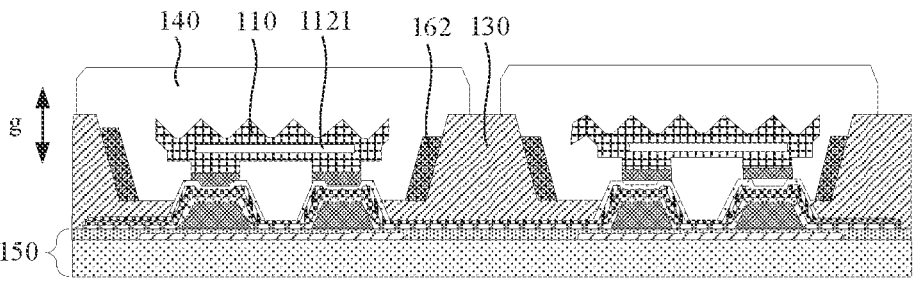
FIG. 7D is a structural diagram of yet another display panel, in accordance with some embodiments.
Figure 7E:
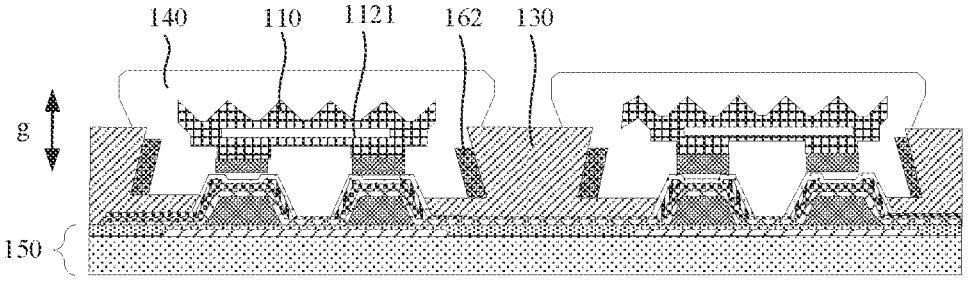
FIG. 7E is a structural diagram of yet another display panel, in accordance with some embodiments.
Figure 7F:
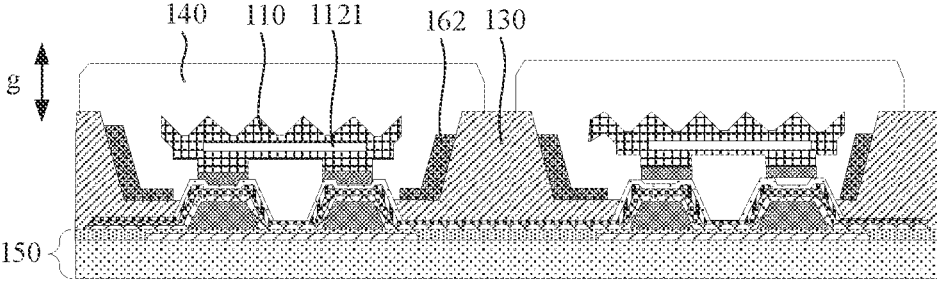
FIG. 7F is a structural diagram of yet another display panel, in accordance with some embodiments.

FIG. 7D is a structural diagram of yet another display panel, in accordance with some embodiments. FIG. 7E is a structural diagram of yet another display panel, in accordance with some embodiments. FIG. 7F is a structural diagram of yet another display panel, in accordance with some embodiments.

In some embodiments, as shown in FIGS. 7A to 7C, the second accommodation sub-region Q2 has a second sub-side wall L2. The display panel 100 further includes a reflective layer 162. The reflective layer 162 covers at least a portion of the second sub-side wall L2; and/or, the reflective layer 162 covers at least a portion of the surface of the first light-shielding sub-pattern 136 away from the driving backplane 150.

It can be understood that, when light is incident on the reflective layer 162, the light can be reflected. For example, the reflective layer 162 is made of a metal material. For example, the material of the reflective layer 162 includes at least one of copper, aluminum and titanium.

In some examples, as shown in FIGS. 7A, 7B, 7D and 7E, the reflective layer 162 covers at least a portion of the second sub-side wall L2, so that the reflective layer 162 may reflect the light incident on the second sub-side wall L2, thereby improving the light utilization efficiency, improving the light extraction efficiency of the light-emitting device 110, and reducing the power consumption of the display panel 100.

In some examples, as shown in FIGS. 7C and 7F, the reflective layer 162 covers at least a portion of the surface of the first light-shielding sub-pattern 136 away from the driving backplane 150, so that the reflective layer 162 may reflect the light incident on the surface of the first light-shielding sub-pattern 136 away from the driving backplane 150, thereby improving the light utilization efficiency and reducing the power consumption of the display panel 100.

It can be understood that, as shown in FIGS. 7C and 7F, in a case where the reflective layer 162 covers at least the portion of the surface of the first light-shielding sub-pattern 136 away from the driving backplane 150, the reflective layer 162 and the extending surface 1561 of the conductive pad 156 are spaced apart, so as to avoid a short circuit of the light-emitting device 110 caused by the electrical connection between the reflective layer 162 and the conductive pad 156, thereby improving the reliability of the display panel 100.

In some embodiments, as shown in FIGS. 7D to 7F, at least a central region of the end surface of the encapsulation portion 140 away from the driving backplane 150 is a plane.

In some examples, as shown in FIGS. 7D to 7F, an orthographic projection of the central region of the encapsulation portion 140 on the driving backplane 150 at least partially overlaps an orthographic projection of the light-emitting portion 1121 on the driving backplane 150. For example, the orthographic projection of the light-emitting portion 1121 on the driving backplane 150 falls in the orthographic projection of the central region of the encapsulation portion 140 on the driving backplane 150.

It can be understood that at least the central region of the end surface of the encapsulation portion 140 away from the driving backplane 150 may be the plane or approximately the plane. Such arrangement may reduce the influence of the encapsulation portion 140 on the light emitted by the light-emitting portion 1121, and improve the display performance of the display panel 100.

Figure 7G:
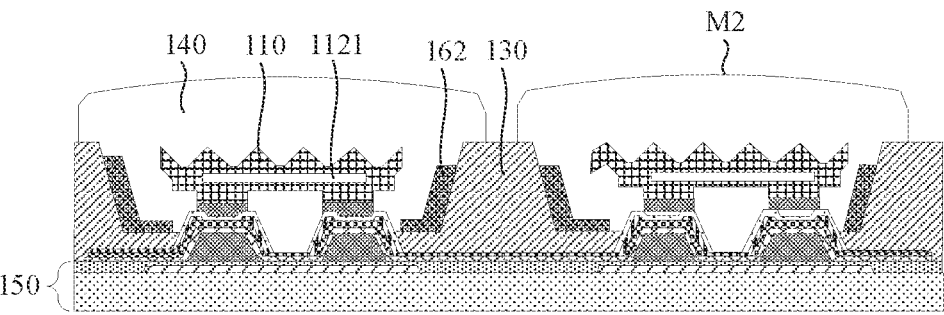
FIG. 7G is a structural diagram of yet another display panel, in accordance with some embodiments.

FIG. 7G is a structural diagram of yet another display panel, in accordance with some embodiments.

In some other embodiments, as shown in FIG. 7G, the end surface of the encapsulation portion 140 away from the driving backplane 150 is a second curved surface M2, and the second curved surface M2 is convex in a direction away from the driving backplane 150.

It can be understood that the end surface of the encapsulation portion 140 away from the driving backplane 150 is set as the second curved surface M2, and the second curved surface M2 is convex in the direction away from the driving backplane 150, so that the second curved surface M2 may play a role of gathering the light, reduce the intensity of light irradiated to other light-emitting device(s) 110, thereby reducing the crosstalk generated between two adjacent light-emitting devices 110, suppressing the lateral excitation between the two adjacent light-emitting devices 110, and improving the display performance of the display panel 100.

It can be understood that, the second curved surface M2 may be the same as or different from the first curved surface M1.

In some embodiments, as shown in FIGS. 7D to 7F, in the thickness direction of the driving backplane 150 (shown by the direction of the arrow g in FIGS. 7D to 7F), the end surface of the encapsulation portion 140 away from the driving backplane 150 is higher than the end surface of the light-shielding pattern 130 away from the driving backplane 150, and the encapsulation portion 140 covers a border region of the end surface of the light-shielding pattern 130 away from the driving backplane 150.

It can be understood that, in the thickness direction of the driving backplane 150, the end surface of the encapsulation portion 140 away from the driving backplane 150 is higher than the end surface of the light-shielding pattern 130 away from the driving backplane 150, which may prevent the light-shielding pattern 130 from covering the side of the encapsulation portion 140 away from the driving backplane 150, thereby avoiding the blocking of the light emitted from the front of the light-emitting portion 1121 by the light-shielding pattern 130, increasing the intensity of the light exiting through the top opening P1, and increasing the light extraction efficiency of the light-emitting device 110. Therefore, the light utilization efficiency may be improved, and the power consumption of the display panel 100 may be reduced.

Moreover, preventing the light-shielding pattern 130 from covering the side of the encapsulation portion 140 away from the driving backplane 150 may also improve the uniformity of the light extraction efficiency of the plurality of light-emitting devices 110, thereby improving the brightness uniformity of the plurality of sub-pixels 101.

In addition, in the thickness direction of the driving backplane 150, the end surface of the encapsulation portion 140 away from the driving backplane 150 is higher than the end surface of the light-shielding pattern 130 away from the driving backplane 150. When an external force is applied to the display panel 100, the encapsulation portion 140 may play a role of supporting, so as to protect the light-emitting device 110 and the light-shielding pattern 130, thereby reducing the risk of damage to the light-emitting device 110 and the light-shielding pattern 130.

For example, as shown in FIGS. 7D to 7F, the encapsulation portion 140 covers the border region of the end surface of the light-shielding pattern 130 away from the driving backplane 150, so that it may shield the border of the light-shielding pattern 130 and reduce the risk of the boundary position between the light-shielding pattern 130 and the encapsulation portion 140 being detected by the naked eye, thereby improving the display performance of the display panel 100.

Figure 8A:
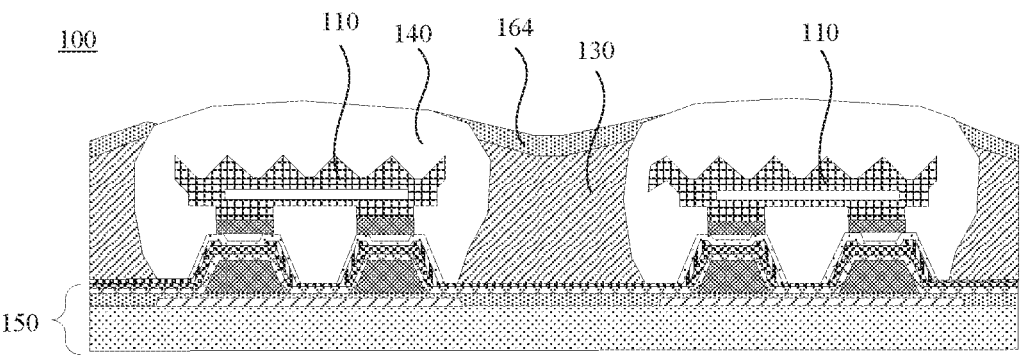
FIG. 8A is a structural diagram of yet another display panel, in accordance with some embodiments.
Figure 8B:
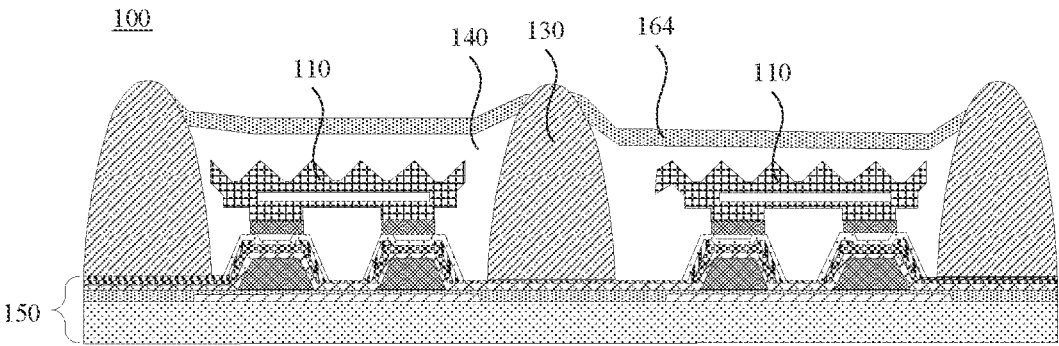
FIG. 8B is a structural diagram of yet another display panel, in accordance with some embodiments.
Figure 8C:
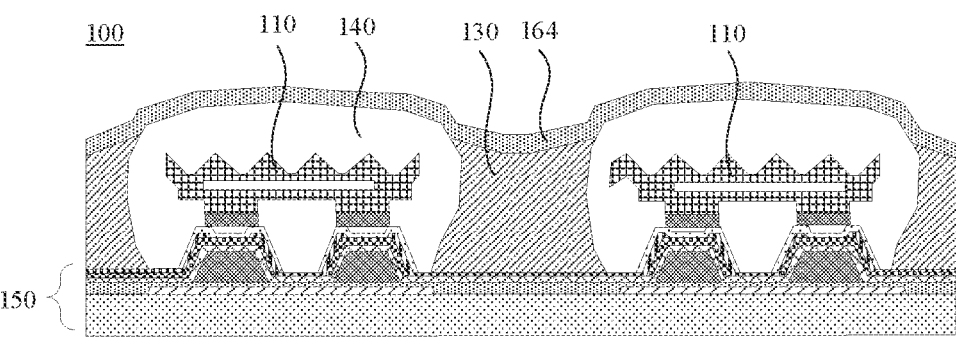
FIG. 8C is a structural diagram of yet another display panel, in accordance with some embodiments.
Figure 8D:
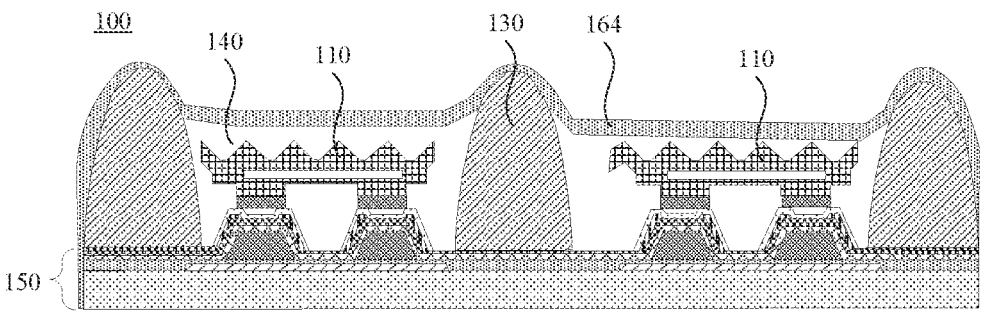
FIG. 8D is a structural diagram of yet another display panel, in accordance with some embodiments.

FIG. 8A is a structural diagram of yet another display panel, in accordance with some embodiments. FIG. 8B is a structural diagram of yet another display panel, in accordance with some embodiments. FIG. 8C is a structural diagram of yet another display panel, in accordance with some embodiments. FIG. 8D is a structural diagram of yet another display panel, in accordance with some embodiments.

In some embodiments, as shown in FIGS. 8A to 8D, the display panel 100 further includes a protective layer 164. The protection layer 164 covers at least one of the end surface of the light-shielding pattern 130 away from the driving backplane 150 and the end surface of the encapsulation portion 140 away from the driving backplane 150.

It can be understood that the protective layer 164 covers at least one of the end surface of the light-shielding pattern 130 away from the driving backplane 150 and the end surface of the encapsulation portion 140 away from the driving backplane 150, so that the protective layer 164 may protect at least one of the end surface of the light-shielding pattern 130 away from the driving backplane 150 and the end surface of the encapsulation portion 140 away from the driving backplane 150, thereby reducing the risk of scratching the encapsulation portion 140 and the light-shielding pattern 130, and improving the reliability of the display panel.

In some examples, the material of the protective layer 164 includes silicon nitride ($SiN_x$). For example, the thickness of the protective layer 164 is in a range from 200 nm to 300 nm, inclusive. Therefore, it may not only prevent the protective layer 164 from being too thin (e.g., less than 200 nm), which may affect the protective effect of the protective layer 164 on the encapsulation portion 140 and the light-shielding pattern 130, but also prevent the protection layer 164 from being too thick (e.g., greater than 300 nm), which is not conducive to thinning the display panel 100.

In some examples, the thickness of the protective layer 164 is 220 nm, 250 nm or 280 nm.

In some examples, as shown in FIG. 8A, the protective layer 164 covers the end surface of the light-shielding pattern 130 away from the driving backplane 150, without covering the end surface of the encapsulation portion 140 away from the driving backplane 150, so as to prevent the protective layer 164 from blocking the light emitted by the light-emitting device 110, thereby improving the light utilization efficiency and reducing the power consumption of the display panel 100.

In some other examples, as shown in FIG. 8B, the protective layer 164 covers the end surface of the encapsulation portion 140 away from the driving backplane 150, without covering the end surface of the light-shielding pattern 130 away from the driving backplane 150, so that the protective layer 164 may protect the encapsulation portion 140, thereby reducing the risk of scratching the encapsulation portion 140, and improving the reliability of the display panel 100.

For example, as shown in FIGS. 8A and 8B, in a case where the protective layer 164 covers one of the light-shielding pattern 130 and the encapsulation portion 140, the protective layer 164 may also cover a part of the border of the other of the light-shielding pattern 130 and the encapsulation portion 140. For example, as shown in FIG. 8A, in a case where the protective layer 164 covers the light-shielding pattern 130, it may cover a part of the border of the encapsulation portion 140. As shown in FIG. 8B, in a case where the protective layer 164 covers the encapsulation portion 140, it may cover a part of the border of the light-shielding pattern 130.

In some other examples, as shown in FIGS. 8C and 8D, the protective layer 164 covers the end surface of the light-shielding pattern 130 away from the driving backplane 150 and the end surface of the encapsulation portion 140 away from the driving backplane 150, so that the protective layer 164 may protect the light-shielding pattern 130 and the encapsulation portion 140, thereby improving the reliability of the display panel 100.

It can be understood that the protective layer 164 is made of a transparent material, which may reduce the blocking of the light emitted by the light-emitting device 110 by the protective layer 164. In some examples, the protective electrode 164 is made of a transparent inorganic material.

Figure 9:
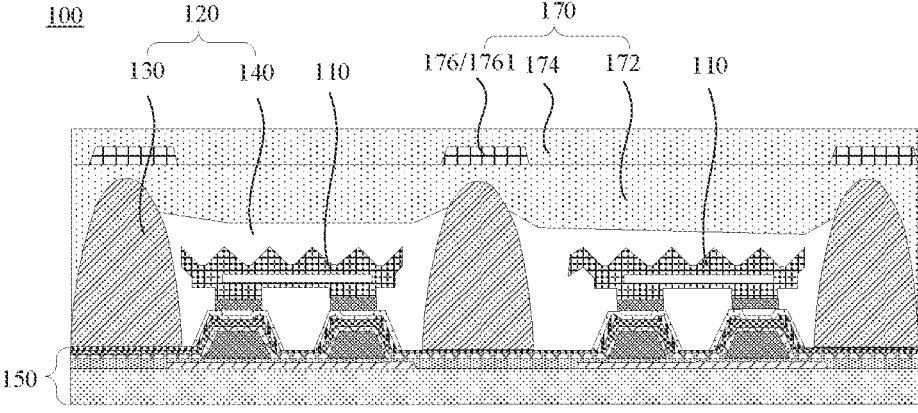
FIG. 9 is a structural diagram of yet another display panel, in accordance with some embodiments.

For example, the protective layer 164 may be formed by using a thin film encapsulation chemical vapor deposition (TFE CVD) process. FIG. 9 is a structural diagram of yet another display panel, in accordance with some embodiments.

It can be known from the above that, in some embodiments, the display panel 100 includes protective layer 164. In some other embodiments, as shown in FIG. 9, the display panel 100 further includes a touch layer 170. The touch layer 170 is located on a side of the light-emitting device 110 away from the driving backplane 150. The touch layer 170 includes a plurality of touch electrodes 176, and the touch electrode 176 includes grid lines 1761. The orthographic projection of the grid lines 1761 on the driving backplane 150 falls into the orthographic projection of the light-shielding pattern 130 on the driving backplane 150.

It can be understood that the touch layer 170 is used to obtain the touch position, so that the display panel 100 can realize the touch function. For example, the touch layer 170 may have a self-capacitance touch structure or a mutual-capacitance touch structure.

It can be understood that the touch layer 170 is made of a transparent material, which may reduce the blocking of the light emitted by the light-emitting device 110 by the touch layer 170, thereby increasing the light extraction efficiency of the light-emitting device 110, and reducing the power consumption of the display panel 100.

For example, as shown in FIG. 9, the touch layer 170 is located on the side of the encapsulation structure 120 away from the driving backplane 150, which plays a role of protecting the encapsulation structure 120 (including the light-shielding pattern 130 and the encapsulation portions 140), thereby reducing the risk of scratching the encapsulation structure 120.

In some examples, the touch layer 170 further includes an adhesive layer 172 and a touch function layer 174, and the adhesive layer 172 is located between the touch function layer 174 and the encapsulation structure 120. It can be understood that the adhesive layer 172 plays a role of fixing and bonding, so as to prevent the touch function layer 174 from shifting relative to the encapsulation structure 120, thereby improving the reliability of the display panel 100.

In some examples, the material of the adhesive layer 172 includes photoresist, such as the OC adhesive.

As shown in FIG. 9, the touch electrode 176 is located in the touch function layer 174 and is used for obtaining the touch position. For example, the touch electrode 176 includes the grid lines 1761, and the grid lines 1761 is used for transmitting electrical signals. The orthographic projection of the grid lines 1761 on the driving backplane 150 falls into the orthographic projection of the light-shielding pattern 130 on the driving backplane 150, which may reduce the blocking of the light exiting from the front of the light-emitting portion 1121 by the grid lines 1761. As a result, the light extraction efficiency of the light-emitting device 110 may be improved, and the power consumption of the display panel 100 may be reduced.

FIG. 10 is a flow diagram of a method for manufacturing a display panel, in accordance with some embodiments of the present disclosure.

In addition, some embodiments of the present disclosure provide a method for manufacturing a display panel, which is used to manufacture the display panel 100 mentioned above.

In some embodiments, as shown in FIG. 10, the method for manufacturing the display panel includes the following steps.

In step S101, the plurality of light-emitting devices are electrically connected to the driving backplane. The plurality of light-emitting devices are located on the first side of the driving backplane, and the plurality of light-emitting devices are spaced apart from each other. The light-emitting device includes the device main body and the device pins. The device main body includes the light-emitting portion, and the device pins are electrically connected to the driving backplane.

In step S102, the encapsulation structure is formed on the first side of the driving backplane. The encapsulation structure includes the light-shielding pattern and the plurality of encapsulation portions. The light-shielding pattern has the plurality of accommodation regions, and the accommodation region exposes at least one light-emitting device. At least part of the encapsulation portion is located in the accommodation region and covers the light-emitting device. The light-emitting portion of the at least one light-emitting device is located in the accommodation region.

The method for manufacturing the display panel has the same beneficial effects as the display panel described above, and details are not repeated here.

It can be understood that the encapsulation structure 120 is formed after the plurality of light-emitting devices 110 are electrically connected to the driving backplane 150, which may reduce the thickness of the light-emitting devices 110, improve the thickness uniformity of the plurality of light-emitting devices 110, and facilitate the thinning of the display panel 100.

In some embodiments, forming the encapsulation structure on the first side of the driving backplane includes the following steps.

The plurality of encapsulation portions are firstly formed on the first side of the driving backplane.

Then the light-shielding pattern is formed on the first side of the driving backplane.

For example, as shown in FIG. 3C, the plurality of patterned encapsulation portions 140 may be formed by exposing, developing and cleaning the negative photoresist (such as a transparent OC adhesive), and the side wall surface of the encapsulation portion 140 and the driving backplane are made to have a first included angle θ. After the plurality of encapsulation portions 140 are formed, as shown in FIG. 3A, the light-shielding pattern 130 (e.g., the black photoresist) is filled in gaps between the plurality of encapsulation portions 140, so as to form the encapsulation structure 120.

Moreover, in the thickness direction of the driving backplane 150 (shown by the direction of the arrow g in FIG. 3A), the end surface of the encapsulation portion 140 away from the driving backplane 150 is higher than the end surface of the light-shielding pattern 130 away from the driving backplane 150. Therefore, it may avoid the light-shielding pattern 130 flowing to the end surface of the encapsulation portion 140 away from the driving backplane 150 when the light-shielding pattern 130 is formed between two adjacent encapsulation portions 140, thereby avoiding the blocking of the light exiting from the front of the light-emitting portion 1121 by the light-shielding pattern 130, improve the light extraction efficiency of the light-emitting device 110 and reduce the power consumption of the display panel 100.

In some other embodiments, forming the encapsulation structure on the first side of the driving backplane includes the following steps.

The light-shielding pattern is firstly formed on the first side of the driving backplane.

Then the encapsulation portions are formed in the accommodation regions of the light-shielding pattern.

For example, as shown in FIG. 5A, the light-shielding pattern 130 having the plurality of accommodation regions Q may be formed by exposing, developing, and cleaning the positive photoresist, and the side wall L of the accommodation region Q and the surface of the light-shielding pattern 130 proximate to the driving backplane 150 are made to have a first included angle θ, and the first included angle θ is an acute angle. As shown in FIG. 5B, after the light-emitting device 110 is electrically connected to the driving backplane 150, the encapsulation portion 140 covering the light-emitting device 110 is formed.

As shown in FIG. 5B, in the thickness direction of the driving backplane 150 (shown by the direction of the arrow g in FIG. 5B), the end surface of the encapsulation portion 140 away from the driving backplane 150 is lower than the end surface of the light-shielding pattern 130 away from the driving backplane 150, so that both the light-emitting device 110 and the encapsulation portion 140 may be located in the accommodation region Q, thereby improving the blocking effect of the light-shielding pattern 130 on the side light leakage of the light-emitting device 110, reducing the crosstalk generated between two adjacent light-emitting devices 110, suppressing the lateral excitation between the two adjacent light-emitting devices 110, and improving the display performance of the display panel 100.

In summary, the embodiments of the present disclosure have at least the following beneficial effects.

The light-shielding pattern 130 has the plurality of accommodation regions Q, the light-emitting portion 1121 of at least one light-emitting device 110 is located in the accommodation region Q, so that the light-shielding pattern 130 may blocking the side light leakage of the light-emitting device 110 (including the side light leakage caused by the adherent structure 1123, or the side light leakage caused by other structure(s) such as the soldering flux 113 in the display panel 100), improving the uniformity of the light-emitting areas of the plurality of light-emitting devices 110, reducing the crosstalk generated between two adjacent light-emitting devices 110, suppressing the lateral excitation between the two adjacent light-emitting devices 110, and improving the display performance of the display panel 100.

Moreover, the light-emitting device 110 is packaged by means of covering the light-emitting device 110 with the encapsulation portion 140, without using the black adhesive film 111 for packaging. Therefore, it may be possible to improve the light utilization efficiency, improve the light extraction efficiency of the light-emitting device 110, and reduce the power consumption of the display panel 100.

In addition, the encapsulation portion 140 may protect the adherent structure 1123 to reduce the risk of the adherent structure 1123 being broken under pressure, thereby reducing the risk of the driving backplane 150 or other structures of the display panel 100 being scratched caused by fragmentation and detachment of the adherent structure 1123, and improving the reliability of the display panel 100. Moreover, the encapsulation portion 140 protecting the adherent structure 1123 may also reduce the risk of the device pins 114 falling off relative to the conductive pad 156 due to the pressure on the adherent structure 1123, thereby improving the reliability of the display panel 100.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
a driving backplane;
a plurality of light-emitting devices located on a first side of the driving backplane, the plurality of light-emitting devices being disposed at intervals, wherein the plurality of light-emitting devices each include a device main body and device pins; the device main body includes a light-emitting portion, and the device pins are electrically connected to the driving backplane; and
an encapsulation structure located on the first side of the driving backplane, wherein the encapsulation structure includes a light-shielding pattern and a plurality of encapsulation portions; the light-shielding pattern has a plurality of accommodation regions, and an accommodation region exposes at least one light-emitting device; at least part of an encapsulation portion is located in the accommodation region and covers the at least one light-emitting device, wherein
the light-emitting portion of the at least one light-emitting device is located in the accommodation region; and
the device main body includes a main body structure and an adherent structure, the light-emitting portion is located in the main body structure, and the adherent structure is connected to the main body structure.

2. The display panel according to claim 1, wherein the accommodation region has a top opening and a bottom opening, and relative to the bottom opening, the top opening is farther away from the driving backplane; and an area of the top opening is larger than an area of the bottom opening.

3. The display panel according to claim 2, wherein the accommodation region has a side wall, the side wall and a surface of the light-shielding pattern proximate to the driving backplane have a first included angle therebetween, and the first included angle is an acute angle.

4. The display panel according to claim 3, wherein the first included angle is less than or equal to 75°.

5. The display panel according to claim 3, wherein in a thickness direction of the driving backplane, an end surface of the encapsulation portion away from the driving backplane is higher than an end surface of the light-shielding pattern away from the driving backplane; the end surface of the encapsulation portion away from the driving backplane is a first curved surface, and the first curved surface is convex in a direction away from the driving backplane.

6. The display panel according to claim 5, wherein the encapsulation portion includes a first part of the encapsulation portion and a second part of the encapsulation portion, and the first part of the encapsulation portion is closer to the driving backplane relative to the second part of the encapsulation portion;

the first part of the encapsulation portion surrounds the at least one light-emitting device, and an end surface of the first part of the encapsulation portion away from the driving backplane is flush with an end surface of the at least one light-emitting device away from the driving backplane; the second part of the encapsulation portion is located on a side of the first part of the encapsulation portion away from the driving backplane, and covers the first part of the encapsulation portion and the at least one light-emitting device;
the end surface of the first part of the encapsulation portion away from the driving backplane and the driving backplane have a third distance therebetween, and an end surface of the second part of the encapsulation portion proximate to the first part of the encapsulation portion and an end surface of the second part of the encapsulation portion away from the first part of the encapsulation portion have a fourth distance therebetween; and
the end surface of the light-shielding pattern away from the driving backplane and the driving backplane have a fifth distance therebetween; the fifth distance is greater than or equal to the third distance and less than or equal to a sum of 50% of the fourth distance and the third distance.

7. The display panel according to claim 1, wherein a shape of the light-shielding pattern in a longitudinal section includes a semi-ellipse, and the longitudinal section is parallel to a thickness direction of the driving backplane; and
the semi-ellipse has a first side and a second side, and both ends of the first side are connected to both ends of the second side; the first side is disposed proximate to the driving backplane, and the second side is convex in a direction away from the driving backplane.

8. The display panel according to claim 7, wherein in the thickness direction of the driving backplane, an end surface of the encapsulation portion away from the driving backplane is lower than an end surface of the light-shielding pattern away from the driving backplane; and at least a central region of the end surface of the encapsulation portion away from the driving backplane is a plane.

9. The display panel according to claim 8, wherein the light-shielding pattern includes a first part of the light-shielding pattern and a second part of the light-shielding pattern, and the first part of the light-shielding pattern is closer to the driving backplane relative to the second part of the light-shielding pattern;
an end surface of the first part of the light-shielding pattern away from the driving backplane is flush with an end surface of the at least one light-emitting device away from the driving backplane; and the second part of the light-shielding pattern is located on a side of the first part of the light-shielding pattern away from the driving backplane;
the end surface of the first part of the light-shielding pattern away from the driving backplane and the driving backplane have a first distance therebetween, and an end surface of the second part of the light-shielding pattern proximate to the first part of the light-shielding pattern and an end surface of the second part of the light-shielding pattern away from the first part of the light-shielding pattern have a second distance therebetween; and
the second distance is greater than or equal to 30% of the first distance and less than or equal to twice the first distance.

10. The display panel according to claim 1, wherein the accommodation region includes a first accommodation sub-region and a second accommodation sub-region, and the first accommodation sub-region and the second accommodation sub-region are communicated; an orthographic projection of an edge of an opening of the first accommodation sub-region on the driving backplane is located within a region surrounded by an orthographic projection of an edge of an opening of the second accommodation sub-region on the driving backplane; and the driving backplane includes a backplane main body and a plurality of pad components, and the plurality of pad components are electrically connected to the backplane main body; a pad component passes through the first accommodation sub-region and is soldered to the at least one light-emitting device; and the light-emitting portion of the at least one light-emitting device is located in the second accommodation sub-region.

11. The display panel according to claim 1, wherein the encapsulation portion includes a first part of the encapsulation portion and a second part of the encapsulation portion, and the first part of the encapsulation portion is closer to the driving backplane relative to the second part of the encapsulation portion;

the first part of the encapsulation portion surrounds the at least one light-emitting device, and an end surface of the first part of the encapsulation portion away from the driving backplane is flush with an end surface of the at least one light-emitting device away from the driving backplane; the second part of the encapsulation portion is located on a side of the first part of the encapsulation portion away from the driving backplane, and covers the first part of the encapsulation portion and the at least one light-emitting device;

the end surface of the first part of the encapsulation portion away from the driving backplane and the driving backplane have a third distance therebetween, and an end surface of the second part of the encapsulation portion proximate to the first part of the encapsulation portion and an end surface of the second part of the encapsulation portion away from the first part of the encapsulation portion have a fourth distance therebetween; and the fourth distance is greater than or equal to 30% of the third distance and less than or equal to twice the third distance.

12. The display panel according to claim 1, further comprising:

a protective layer covering at least one of an end surface of the light-shielding pattern away from the driving backplane and an end surface of the encapsulation portion away from the driving backplane; and/or the display panel further comprising:

a touch layer located on a side of the plurality of light-emitting devices away from the driving backplane, wherein the touch layer includes a plurality of touch electrodes, and a touch electrode includes grid lines; an orthographic projection of the grid lines on the driving backplane is located within an orthographic projection of the light-shielding pattern on the driving backplane.

13. A method for manufacturing a display panel, the method being configured to manufacture the display panel according to claim 1, and the method comprising:

electrically connecting the plurality of light-emitting devices to the driving backplane, wherein the plurality of light-emitting devices are located on the first side of the driving backplane, and the plurality of light-emitting devices are disposed at intervals; the plurality of light-emitting devices each include the device main body and the device pins; the device main body includes the light-emitting portion, and the device pins are electrically connected to the driving backplane; and forming the encapsulation structure on the first side of the driving backplane, wherein the encapsulation structure includes the light-shielding pattern and the plurality of encapsulation portions; the light-shielding pattern has the plurality of accommodation regions, and the accommodation region exposes the at least one light-emitting device; at least the part of the encapsulation portion is located in the accommodation region and covers the at least one light-emitting device; and the light-emitting portion of the at least one light-emitting device is located in the accommodation region.

14. A display panel, comprising:

a driving backplane;

a plurality of light-emitting devices located on a first side of the driving backplane, the plurality of light-emitting devices being disposed at intervals, wherein the plurality of light-emitting devices each include a device main body and device pins; the device main body includes a light-emitting portion, and the device pins are electrically connected to the driving backplane; and an encapsulation structure located on the first side of the driving backplane, wherein the encapsulation structure includes a light-shielding pattern and a plurality of encapsulation portions; the light-shielding pattern has a plurality of accommodation regions, and an accommodation region exposes at least one light-emitting device; at least part of an encapsulation portion is located in the accommodation region and covers the at least one light-emitting device, wherein the light-emitting portion of the at least one light-emitting device is located in the accommodation region;

the accommodation region includes a first accommodation sub-region and a second accommodation sub-region, and the first accommodation sub-region and the second accommodation sub-region are communicated; an orthographic projection of an edge of an opening of the first accommodation sub-region on the driving backplane is located within a region surrounded by an orthographic projection of an edge of an opening of the second accommodation sub-region on the driving backplane; and the driving backplane includes a backplane main body and a plurality of pad components, and the plurality of pad components are electrically connected to the backplane main body; a pad component passes through the first accommodation sub-region and is soldered to the at least one light-emitting device; and the light-emitting portion of the at least one light-emitting device is located in the second accommodation sub-region.

15. The display panel according to claim 14, wherein the light-shielding pattern includes a first light-shielding sub-pattern and a second light-shielding sub-pattern that are stacked, and the first light-shielding sub-pattern is closer to the driving backplane relative to the second light-shielding sub-pattern; the first light-shielding sub-pattern has the first accommodation sub-region, and the second light-shielding sub-pattern has the second accommodation sub-region.

16. The display panel according to claim 15, wherein a shape of the first light-shielding sub-pattern in a longitudinal section includes a first trapezoid, and the longitudinal section is parallel to a thickness direction of the driving backplane; the first trapezoid has a first base and a second base, the first base is parallel to the second base, and a length of the first base is smaller than a length of the second base; and the first base is closer to the driving backplane relative to the second base; or the first base is farther away from the driving backplane relative to the second base; and/or a shape of the second light-shielding sub-pattern in the longitudinal section includes a second trapezoid; the second trapezoid has a third base and a fourth base, the third base is parallel to the fourth base, and a length of the third base is smaller than a length of the fourth base; and the third base is farther away from the driving backplane relative to the fourth base, or the third base is closer to the driving backplane relative to the fourth base.

17. The display panel according to claim 15, wherein the pad component includes at least two conductive pads; a conductive pad includes an extension surface and a soldering surface; the soldering surface is connected to an end of the extension surface away from the backplane main body; and the device pins are soldered onto the soldering surface; and the first accommodation sub-region has a first sub-side wall, and the first sub-side wall is in contact with at least a portion of the extension surface, wherein in a thickness direction of the driving backplane, a border region of the soldering surface is higher than a central region of the soldering surface.

18. The display panel according to claim 15, wherein the second accommodation sub-region has a second sub-side wall; and the display panel further comprises a reflective layer;

the reflective layer covers at least a portion of the second sub-side wall; and/or the reflective layer covers at least a portion of a surface of the first light-shielding sub-pattern away from the driving backplane.

19. The display panel according to claim 14, wherein at least a central region of an end surface of the encapsulation portion away from the driving backplane is a plane; or the end surface of the encapsulation portion away from the driving backplane is a second curved surface, and the second curved surface is convex in a direction away from the driving backplane.

20. The display panel according to claim 14, wherein in a thickness direction of the driving backplane, an end surface of the encapsulation portion away from the driving backplane is higher than an end surface of the light-shielding pattern away from the driving backplane, and the encapsulation portion covers a border region of the end surface of the light-shielding pattern away from the driving backplane.

* * * * *